United States Patent
Takaoka et al.

(10) Patent No.: US 7,354,810 B2
(45) Date of Patent: Apr. 8, 2008

(54) METHOD OF AND APPARATUS FOR MANUFACTURING SEMICONDUCTOR THIN FILM, AND METHOD OF MANUFACTURING THIN FILM TRANSISTOR

(75) Inventors: Hiromichi Takaoka, Tokyo (JP); Mitsuru Nakata, Tokyo (JP)

(73) Assignee: NEC Corporation, Tokyo (JP)

( * ) Notice: Subject to any disclaimer, the term of this patent is extended or adjusted under 35 U.S.C. 154(b) by 272 days.

(21) Appl. No.: 10/856,275

(22) Filed: May 28, 2004

(65) Prior Publication Data
US 2005/0003591 A1    Jan. 6, 2005

(30) Foreign Application Priority Data
May 30, 2003    (JP) ............................. 2003-156033

(51) Int. Cl.
*H01L 21/324* (2006.01)
(52) U.S. Cl. .................... 438/166; 438/487; 117/8; 257/E21.134
(58) Field of Classification Search ............. 438/166, 438/487, FOR. 334, FOR. 418; 257/E21.134; 117/8
See application file for complete search history.

(56) References Cited

U.S. PATENT DOCUMENTS 6,300,175 B1 * 10/2001 Moon ........................ 438/158
6,736,895 B2 * 5/2004 Jung ........................... 117/37
6,770,545 B2 * 8/2004 Yang .......................... 438/487
6,825,493 B2 * 11/2004 Jung ............................ 257/64
6,825,496 B2 * 11/2004 Yamazaki et al. ............ 257/72
2003/0042430 A1 * 3/2003 Tanaka et al. ............ 250/492.1
2003/0218170 A1 * 11/2003 Yamazaki et al. ............ 257/59
2004/0087116 A1 * 5/2004 Nakayama .................. 438/487

FOREIGN PATENT DOCUMENTS

JP    2002-217206    8/2002

OTHER PUBLICATIONS

"Sequential lateral solidification of thin silicon films on SiO$_2$"; Robert S. Sposili and James S. Im; American Institute of Physics, Appl. Phys. Lett. 69(19), Nov. 4, 1996, pp. 2864-2866).
"Excimer-Laser-Induced Lateral-Growth of Silicon Thin-Films"; Kensuke Ishikawa, Motohiro Ozawa, Chang-Ho Oh, and Masakiyo Matsumura; Japanese Journal of Applied Physics, vol. 37 (1998) pp. 731-736, Part 1, No. 3A, Mar. 1998.

* cited by examiner

*Primary Examiner*—George Fourson
(74) *Attorney, Agent, or Firm*—Muirhead and Saturnelli, LLC

(57) ABSTRACT

A method of manufacturing a semiconductor thin film includes (A) forming an amorphous semiconductor film on a substrate, (B) irradiating a beam to a surface of the amorphous semiconductor film such that a predetermined region of the amorphous semiconductor film is melted and solidified to form a crystallized semiconductor film, and (C) scanning the beam in a first direction. A second direction is a direction on the surface of the amorphous semiconductor film perpendicular to the first direction. A length along the second direction of a cross section of the beam is substantially equal to or less than two times a width along the second direction of the crystallized semiconductor film.

19 Claims, 20 Drawing Sheets

G - G'

SCANNING DIRECTION →

APERTURE INTERVAL 0

APERTURE INTERVAL 0.6 μm

APERTURE INTERVAL 0.9 μm

APERTURE INTERVAL 1.05 μm

APERTURE INTERVAL 1.2 μm

APERTURE INTERVAL 1.8 μm

COMPARATIVE EXAMPLE

EXAMPLE 3

EXAMPLE 4-1

SCANNING DIRECTION →

STARTING LOCATION    ENDING LOCATION

EXAMPLE 4-2

SCANNING DIRECTION →

STARTING LOCATION    ENDING LOCATION

EXAMPLE 4-3

SCANNING DIRECTION →

STARTING LOCATION    ENDING LOCATION

EXAMPLE 5-1          SCANNING DIRECTION

EXAMPLE 5-2          SCANNING DIRECTION

EXAMPLE 6-1    SCANNING DIRECTION

STARTING LOCATION          ENDING LOCATION

EXAMPLE 6-2    SCANNING DIRECTION

STARTING LOCATION          ENDING LOCATION

METHOD OF AND APPARATUS FOR MANUFACTURING SEMICONDUCTOR THIN FILM, AND METHOD OF MANUFACTURING THIN FILM TRANSISTOR

BACKGROUND OF THE INVENTION

1. Field of the Invention

The present invention relates to a method of manufacturing a semiconductor thin film, an apparatus for manufacturing a semiconductor thin film, and a method of manufacturing a thin film transistor (TFT). More particularly, the present invention relates to a method of manufacturing a semiconductor thin film in which the formation of a grain boundary is controlled, and a thin film transistor having a layer of the semiconductor thin film.

2. Description of the Related Art

As a display of an electronic product such as a personal computer and the like, a liquid crystal display (LCD) is known and widely used. In particular, an active matrix liquid crystal display (AM-LCD) has been rapidly popularized in recent years, because high quality images can be achieved due to switching devices provided for respective pixels. In the AM-LCD, a thin film transistor (referred to as "TFT", hereinafter) is used as a switching device for controlling a pixel and as a driver IC. In addition to a liquid crystal display, such a TFT is also used in a driving-circuit-integrated-type image sensor and a fluorescent display tube and the like.

FIGS. 1A to 1D show conventional processes to manufacture the above-mentioned TFT. At first, as shown in FIG. 1A, an amorphous silicon film 202 is formed on a surface of a glass substrate 100, for example. This amorphous silicon film 202 is a precursor film of a semiconductor layer which will be described later. Next, as shown in FIG. 1B, a laser light 300 is irradiated to the surface of the amorphous silicon film 202, and crystal grains are grown. As a result, a polycrystalline silicon (poly-silicon) film 102 is formed from the amorphous silicon film 202. Here, the laser annealing is carried out by scanning the laser light 300 from one end (for example, the left end in FIG. 1B) of the amorphous silicon film 202 to the other end (the right end in FIG. 1B).

Then, as shown in FIG. 1C, a gate insulating film 104 is formed on the formed poly-silicon film 102. Then, the channel-doping is performed on a channel region 120 of the semiconductor layer (poly-silicon film) 102. After that, a gate electrode 106 is formed on the gate insulating film 104.

Next, as shown in FIG. 1D, a first inter-layer insulating film 130 is formed so as to cover the gate electrode 106 and the gate insulating film 104. Then, contact holes 108a, 110a are formed to penetrate the first inter-layer insulating film 130 and the gate insulating film 104. Then, a source electrode 108 connected to the contact hole 108a and a drain electrode 110 connected to the contact hole 110a are formed on the first inter-layer insulating film 130. Then, a second inter-layer insulating film 132 is formed so as to cover the source electrode 108 and the drain electrode 110. Thus, the TFT is manufactured.

In recent years, the fineness of an LCD tends to be increasingly improved, and also the higher performance is required for an LCD to support the higher resolution moving image. Therefore, a TFT used to control the pixels is desired to operate faster. A TFT can operate faster as the mobility of carrier (electron or hole) in the poly-silicon film 102 increases. However, if there are a large number of grain boundaries in the poly-silicon film 102, the mobility of the carrier decreases, which results in a problem that the mobility of the TFT can not be made faster.

Therefore, a technique has been proposed, in which the crystal growth during the laser annealing process is controlled in order to reduce the number of the grain boundaries in the poly-silicon film 102 and hence to improve the mobility of the carrier.

Japanese Laid Open Patent Application (JP-P-2002-217206) discloses a technique in which a rectangular laser line beam is irradiated to form a poly-silicon layer which has crystal grains extending for a length equal to about half of a width of the laser line beam.

FIG. 2 is a schematic picture for explaining this technique. According to this technique, the rectangular laser line beam with the size of about 5 μm×100 μm is irradiated to an amorphous silicon layer 303 shown in FIG. 2. At this time, the profile of the laser beam energy density is trapezoidal as shown on the left side of FIG. 2. As a result, silicon seed crystals (not shown) are randomly generated in portions of the amorphous silicon layer indicated by Y1 and Y2 which correspond to the ends of the laser line beam. Then, poly-silicon grows from those silicon seed crystals toward a portion which corresponds to the center of the laser line beam and is indicated by Y3. The growth of the poly-silicon stops at the portion Y3. In this way, a poly-silicon layer 303' (331, 332) is formed, which has crystal grains extending for the length equal to about half of the width of the laser line beam. Here, the grain boundaries extend from the portion Y1, Y2 to the portion Y3.

According to this technique, it is possible to make the mobility of the thin film transistor and ON-state current higher by setting the growth direction of the crystal (poly-silicon) into alignment with a carrier running direction in the thin film transistor. However, there is a problem with this technique in that the formation of the grain boundaries can not be controlled, even though the growth direction of the crystal can be controlled to some degree. If the grain boundary crosses the channel portion of the thin film transistor, the desired mobility of the carrier can not be obtained. Also, the diameter of the crystal grain is at most the length equal to the half of the width of the laser line beam. Thus, there is also a problem with this technique in that poly-silicon with a large grain diameter can not be formed.

As another technique, James S. Im et al. reports a technique in which a narrow beam is scanned to form a giant crystal grain in the scanning direction (refer to a non-patent document: "Sequential lateral solidification of thin silicon films on SiO2", Robert S. Sposili and James S. Im, Appl. Phys. Lett 69 (19) 1996 pp. 2864-2866).

FIGS. 3A to 3E schematically show the processes according to this technique. In this technique, the narrow beam 310 shown in FIG. 3A is made from a pulse laser light by using an appropriate mask. The narrow beam 310 has a width of 5 μm and a length of 200 μm, and is irradiated to an amorphous silicon film 202. This narrow beam 310 is to be scanned along the direction E shown in FIG. 3A, i.e., from one side (indicated by a numeral D in FIG. 3A) to the opposite side (indicated by a numeral S in FIG. 3A). Thus, the amorphous silicon film 202 is to be sequentially heated (annealed) as shown in FIGS. 3B to 3E.

FIG. 3B shows a situation when the first irradiation of the narrow beam 310 is finished. At this time, the crystallization (solidification) of the melted amorphous silicon film 202 starts from boundaries between "the melted region" and "the non-melted region" (indicated by two-dot chain lines in FIG. 3B). Here, these boundaries correspond to the ends of the narrow beam 310 (top and bottom ends in FIG. 3B). Then, the growth of the crystals begins from those boundaries toward the center of the melted region. In this way, the solidified portion becomes a crystallized poly-silicon film 102. The growth of the crystals stops when they collide with each other near the center. Thus, a grain boundary B is formed near the center portion as shown in FIG. 3B. It should be noted that the crystallization advances in the lateral direction in FIG. 3B, and a lot of grain boundaries are formed along the longitudinal direction. These longitudinal grain boundaries will be described later.

Next, as shown in FIG. 3C, the irradiation region (the narrow beam 310) is moved upward, and the second irradiation of the narrow beam 310 is performed. Here, the displacement of the narrow beam 310 is 0.75 μm.

Similarly, the crystallization (solidification) starts from boundaries between "the melted region" and "the non-melted region" as shown in FIG. 3D. These boundaries are indicated by two-dot chain lines in FIG. 3D, and correspond to the ends of the narrow beam 310. Crystals grow from those boundaries toward the center of the melted region, and a grain boundary B' is formed near the center portion as shown in FIG. 3D. At this time, the grain boundary B formed in the previous step disappears due to the melt. Also, the melted portion along the lower boundary crystallizes based on the crystal formed by the previous step (the first irradiation). Therefore, no lateral grain boundary is formed along this lower boundary.

After that, the irradiation region (the narrow beam 310) is moved and the irradiation of the narrow beam 310 is performed sequentially. The melt and crystallization of the amorphous silicon film 202 are repeated in the similar way. Thus, the crystal grains extending in the longitudinal direction (the scanning direction E) can be formed as shown in FIG. 3E, and no grain boundary is formed along the lateral direction (orthogonal to the scanning direction E).

Also, Matsumura et al. reports a technique that uses a light-shield plate in laser annealing (refer to a non-patent document: "Excimer-Laser-Induced Lateral-Growth of Silicon Thin Films", Kensuke Ishikawa, Motohiro Ozawa, Chang-Ho Oh and Masakiyo Matsumra, Jpn. J. Appl. Phys. Vol. 37 (1998) pp. 731-736). FIG. 4A is a schematic picture for explaining this technique, and FIG. 4B is a cross sectional view along a dashed line J-J' in FIG. 4A.

According to this technique, a light-shield plate 400 is placed in a light path to shade a part of the narrow beam 300A, as shown in FIGS. 4A and 4B. A part of the narrow beam 300A is diffracted to be a diffracted beam 310A as shown in FIG. 4B, and the energy density of this diffracted beam 310A becomes low. Therefore, the temperature of the amorphous silicon film 202 associated with the diffracted beam 310A becomes lower than that associated with the directly incoming narrow beam 300A. In other words, the temperature of the irradiation region on the left side of FIG. 4B is higher than the temperature on the right side, i.e., a temperature gradient is generated as indicated by an arrow in FIG. 4B. This temperature gradient promotes the growth of the poly-silicon film 102.

According to the conventional techniques mentioned above, the growth direction of the crystal can be controlled to some degree. However, in the technique disclosed in the above-mentioned patent document, the formation of the grain boundaries can not be controlled. There is also a problem with the other conventional techniques in that the grain boundaries along the scanning direction can not be controlled.

FIG. 5 is a schematic picture explaining such a problem in the conventional technique. In FIG. 5, the longitudinal direction I denotes the scanning direction. As shown in FIG. 5, crystals grow along the direction I. However, each crystal can not grow largely in the direction orthogonal to the direction I, and a lot of grain boundaries B along the direction I are generated in the poly-silicon film 102.

Here, the formation of these grain boundaries B is not controlled, i.e., the locations and the distribution density of the grain boundaries B are not controlled. Therefore, there is a certain distribution in the distances between grain boundaries B adjacent to each other (each distance corresponds to a width t of each crystal 102a). The maximum value of the distance is about 1 μm. Even if the movement direction of the carriers in the TFT is set to the direction I, the movement of the carriers is interfered by the grain boundaries B which are bent in the lateral direction (orthogonal to the direction I) or intersect with other grain boundaries B. This causes the depression of the carrier mobility. Moreover, the widths t of the respective crystals 102a are not constant and vary depending on the manufacturing condition. Furthermore, the number and the directions of the grain boundaries B also vary. Thus, the carrier mobility and the threshold voltage of the manufactured TFT vary depending on the manufacturing condition.

The following may be considered as a reason for the formation of the crystals 102a with the various widths t. When the first irradiation of the laser light 300 is performed on the amorphous silicon film 202, the temperature gradient is not generated along the direction orthogonal to the direction I in the melted amorphous silicon film 202. Therefore, crystal seeds are formed randomly in the direction orthogonal to the direction I. Then, the crystals grow based on the crystal seeds and extend along the direction I as mentioned above. As a result, various crystal grains with various widths t are formed as shown in FIG. 5.

SUMMARY OF THE INVENTION

It is therefore an object of the present invention to provide a method and an apparatus for manufacturing a semiconductor thin film which can reduce the number of grain boundaries in the manufactured semiconductor thin film.

Another object of the present invention is to provide a method and an apparatus for manufacturing a semiconductor thin film which can control the positions of grain boundaries.

Still another object of the present invention is to provide a thin film transistor in which a mobility is improved and variation of the mobility is suppressed, and a method for manufacturing the thin film transistor.

In an aspect of the present invention, a method of manufacturing a semiconductor thin film includes (A) forming an amorphous semiconductor film on a substrate, (B) irradiating a beam to a surface of the amorphous semiconductor film such that a predetermined region of the amorphous semiconductor film is melted and solidified to form a crystallized semiconductor film, and (C) scanning the beam in a first direction.

The first direction is a scanning direction and a second direction is a direction on the surface of the amorphous semiconductor film perpendicular to the first direction. A "beam length" is defined by a length along the second direction of a cross section of the beam. A "crystal growth width" is defined by a width along the second direction of the crystallized semiconductor film. The crystallized semiconductor film may include a single crystal region and a small poly-crystalline silicon region formed around the single crystal region.

According to the present invention, the beam length is substantially equal to or less than two times the crystal growth width. The beam length can be substantially equal to or less than the crystal growth width. Preferably, the beam length is equal to or less than 6 μm.

In another aspect of the present invention, a method of manufacturing a semiconductor thin film includes (AA) forming an amorphous semiconductor film on a substrate, (BB) irradiating a plurality of beams to a surface of the amorphous semiconductor film such that predetermined regions of the amorphous semiconductor film are melted and solidified to form a plurality of crystallized semiconductor films, and (CC) scanning the plurality of beams in the first direction. A "beam length" is a length along the second direction of a cross section of each of the plurality of beams. A "crystal growth width" is a width along the second direction of corresponding one of the plurality of crystallized semiconductor films.

According to the present invention, the beam length is substantially equal to or less than two times the crystal growth width. A plurality of the beam lengths of the plurality of beams can be substantially equal to or less than a plurality of the crystal growth widths of the plurality of crystallized semiconductor films, respectively. Preferably, the beam length of each beam is equal to or less than 6 μm.

In the present invention, the plurality of beams are arranged along the second direction. In this case, an interval between one of the plurality of beams and an adjacent one of the plurality of beams is preferably equal to or more than 0.3 μm. More preferably, the interval is equal to or more than 0.4 μm. More preferably, the interval is equal to or more than 0.6 μm.

In the present invention, each of the plurality of beams belongs to any one of a plurality of beam groups. Thus, each of the plurality of beam groups includes a predetermined number of the beams. The plurality of beam groups are arranged in the first direction. The predetermined number of beams belonging to each beam group are arranged along the second direction.

Also, one of the plurality of beam groups includes a first beam. Another of the plurality of beam groups includes a second beam. A part of the first beam overlaps with a part of the second beam along the first direction. Preferably, a width for which the first beam overlaps with the second beam is equal to or more than 0.7 μm.

In still another aspect of the present invention, a method of manufacturing a semiconductor thin film includes (D) forming an amorphous semiconductor film on a substrate, (E) irradiating a beam to a surface of the amorphous semiconductor film such that a predetermined region of the amorphous semiconductor film is melted and solidified to form a crystallized semiconductor film, and (F) scanning the beam in the first direction.

According to the present invention, during the (E) irradiating step, a temperature distribution of the surface along the second direction has two gradients near both ends of the predetermined region. Preferably, the temperature distribution along the second direction has a trapezoidal shape. A full width at half maximum (FWHM) of the temperature distribution is substantially equal to or less than two times the crystal growth width. The FWHM of the temperature distribution can be substantially equal to or less than the crystal growth width. Here, the two gradients along the second direction are generated by changing amount of the beam along the second direction. Preferably, the change in the amount of the beam along the second direction is equal to or more than 460.8 mJ/cm$^2$ per 1 μm on the surface.

In still another aspect of the present invention, an apparatus for manufacturing a semiconductor thin film has a laser oscillator composed for generating a beam, a stage on which a substrate is placed, a mask, and a means for scanning the beam in a first direction. The mask is provided on a light path of the beam and has a plurality of aperture sections through which the beam from the laser oscillator is irradiated to a surface of the substrate.

The first direction is a scanning direction and a second direction is a direction on the surface of the substrate perpendicular to the first direction. A "beam length" is a length along the second direction of a cross section of the beam on the surface of the substrate. A "crystal growth width" is a width along the second direction of a crystal to be formed on the substrate.

According to the present invention, the beam length is substantially equal to or less than two times the crystal growth width. The beam length can be substantially equal to or less than the crystal growth width. Preferably, the beam length is equal to or less than 6 μm.

In the apparatus, the plurality of aperture sections are arranged along the second direction.

Also, in the apparatus, each of the plurality of aperture sections belongs to any one of a plurality of aperture groups. Thus, each of the plurality of aperture groups includes a predetermined number of the aperture sections. The plurality of aperture groups are arranged in the first direction. The predetermined number of aperture sections belonging to each aperture group are arranged along the second direction. Also, one of the plurality of aperture groups includes a first aperture section, and another of the plurality of aperture groups includes a second aperture section. A part of the first aperture section overlaps with a part of the second aperture section along the first direction.

In still another aspect of the present invention, a method of manufacturing a thin film transistor includes (a) forming an amorphous semiconductor film on a substrate, (b) irradiating a beam to a surface of the amorphous semiconductor film such that a predetermined region of the amorphous semiconductor film is melted and solidified to form a crystal, (c) scanning the beam in the first direction to form a crystallized semiconductor thin film, and (d) forming a channel region of the thin film transistor by using the crystallized semiconductor thin film such that carriers move along the first direction. During the (b) irradiating, the beam length is substantially equal to or less than two times the crystal growth width.

According to the method and the apparatus for manufacturing the semiconductor thin film in the present invention, the following effects can be attained. That is, the width of the crystal along the second direction can be made larger than that of a conventional semiconductor thin film, because of the temperature gradient generated along the second direction. Moreover, the positions of the grain boundaries can be controlled, and also the number of the grain boundaries can be reduced. Also, the positions and the number of the crystals can be controlled.

Furthermore, according to the present invention, a thin film transistor (TFT) is manufactured by using the single crystal region generated by the above apparatus and the above method. Thus, the mobility of the manufactured TFT is improved, because the number of the grain boundaries is reduced. This implies that a TFT with high mobility can be obtained according to the present invention. Moreover, since the number and the directions of the grain boundaries are controlled and hardly vary, the variation in the mobility of the TFT can be suppressed.

DESCRIPTION OF THE PREFERRED EMBODIMENTS

Embodiments of the present invention will be described below with reference to the attached drawings.

Figure 1A:
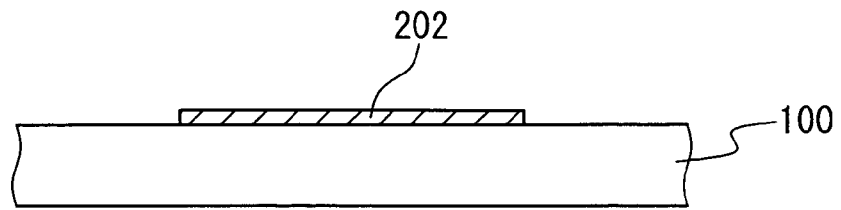
FIGS. 1A to 1D show conventional processes to manufacture a thin film transistor.
Figure 1B:
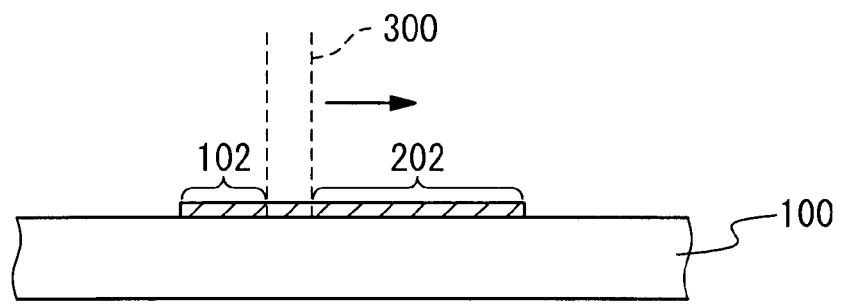
Figure 1C:
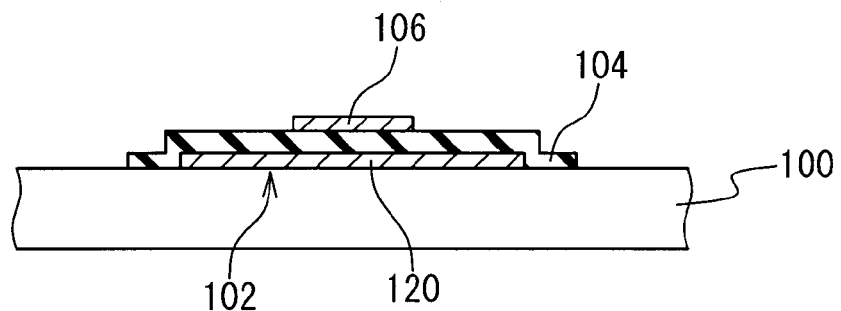
Figure 1D:
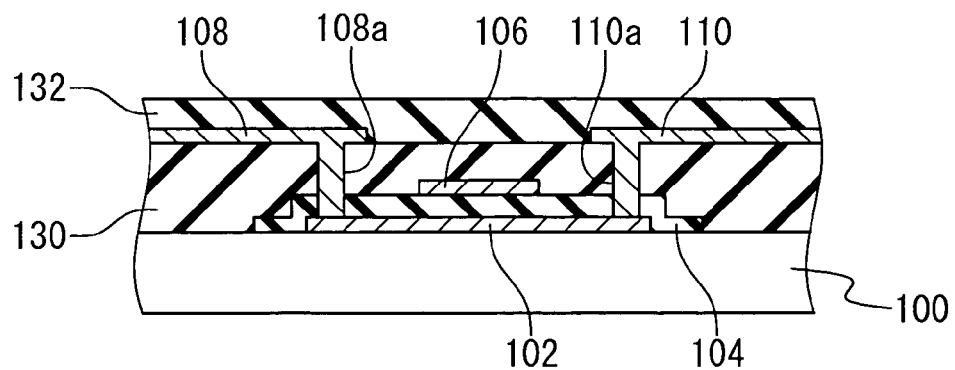
Figure 2:
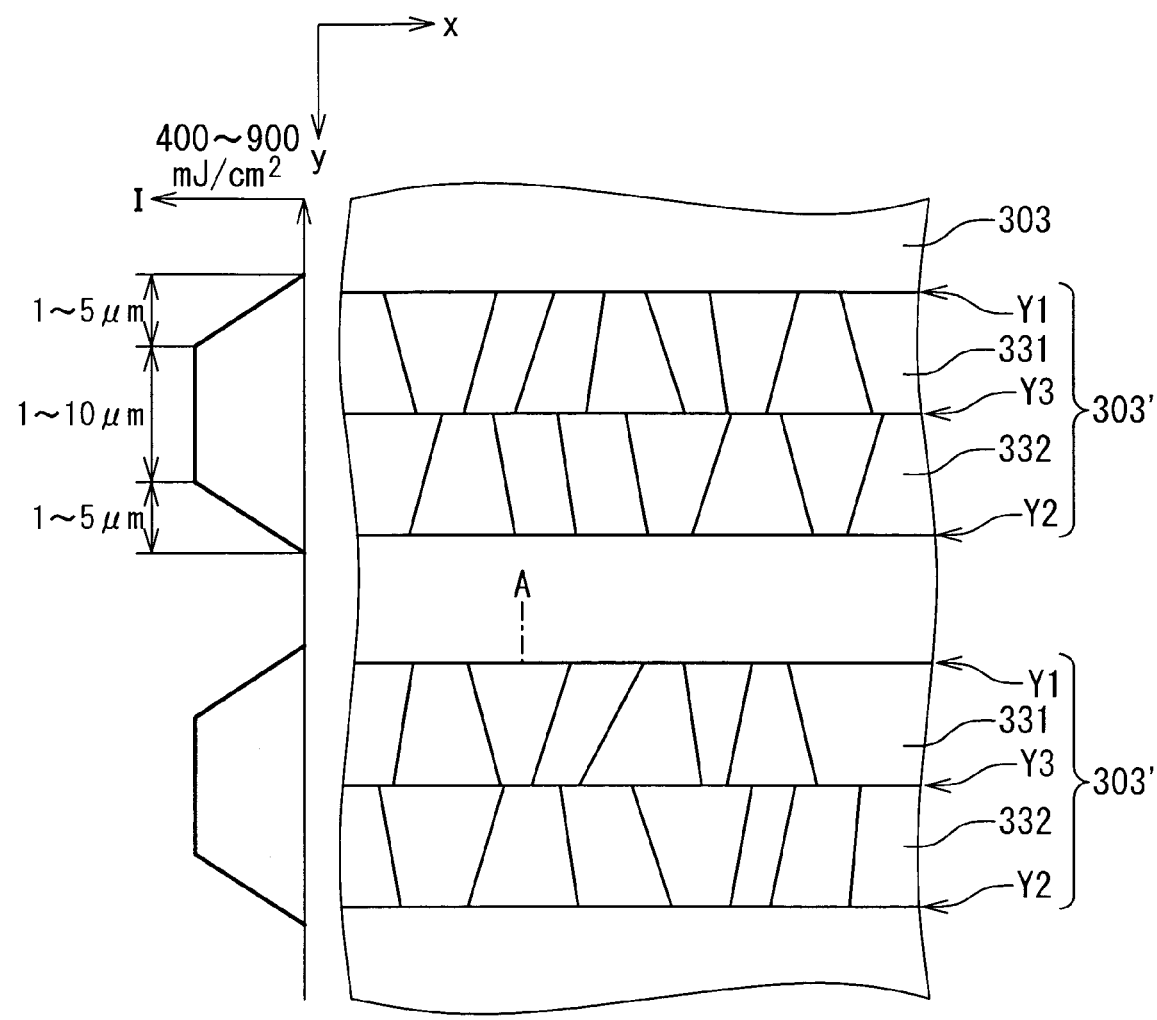
FIG. 2 is a schematic view for explaining a conventional technique.
Figure 3A:
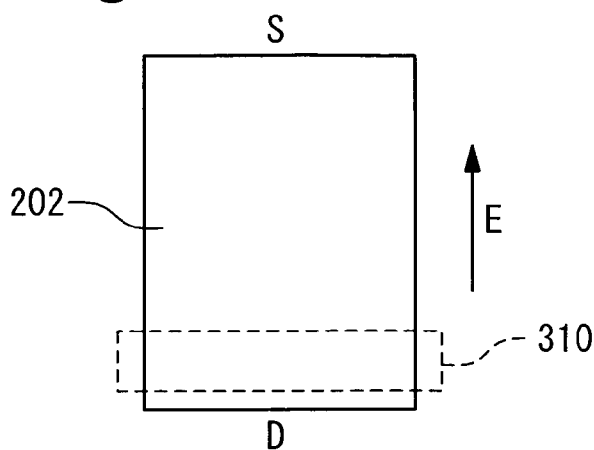
FIGS. 3A to 3E are schematic views for explaining another conventional technique.
Figure 3B:
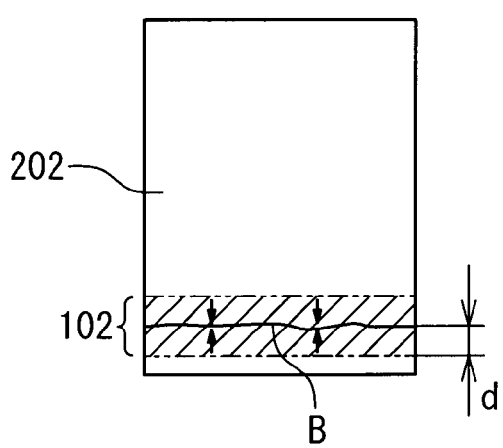
Figure 3C:
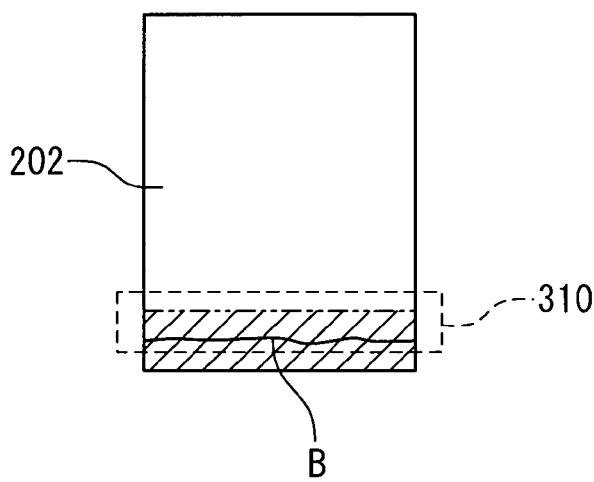
Figure 3D:
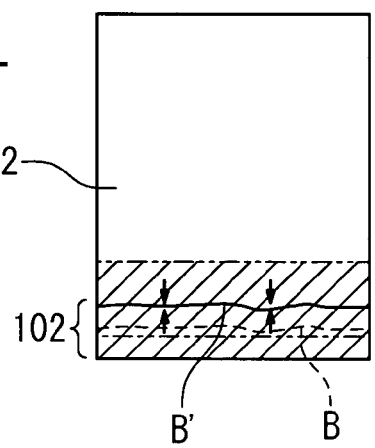
Figure 3E:
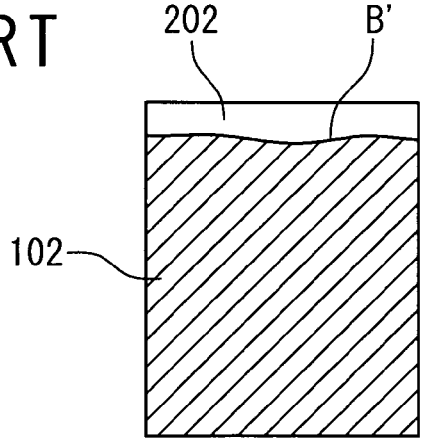
Figure 4A:
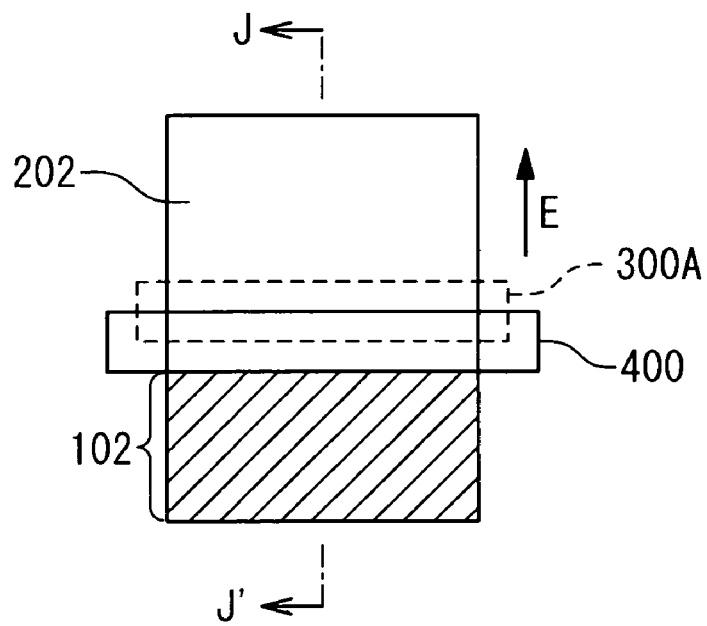
FIG. 4A is a schematic view for explaining still another conventional technique.
Figure 4B:
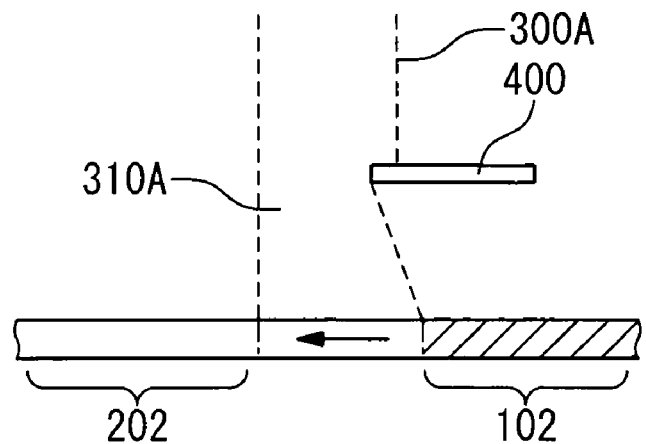
FIG. 4B is a cross sectional view along a dashed line J-J' in FIG. 4A.
Figure 5:
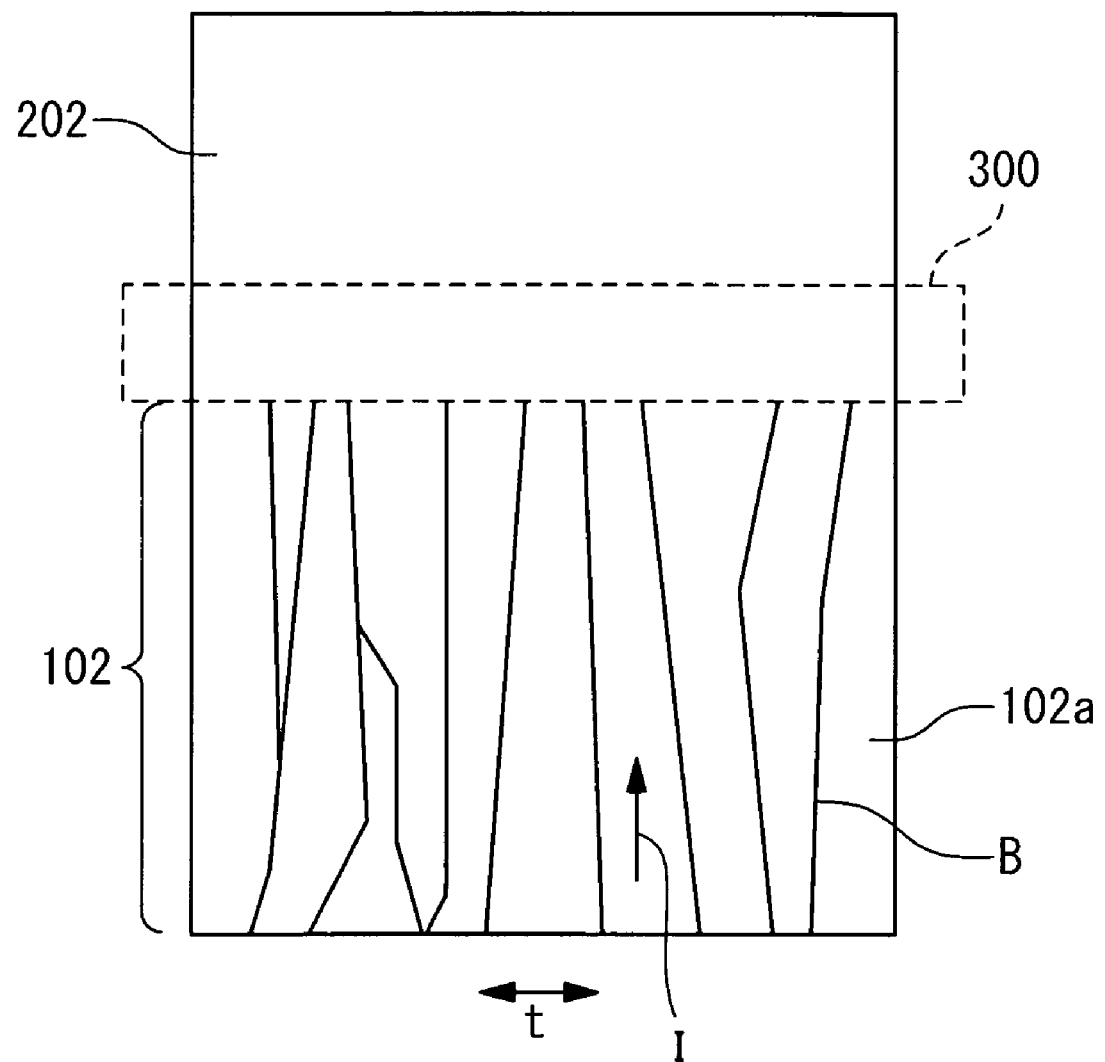
FIG. 5 is a schematic view for explaining conventional techniques.
Figure 6:
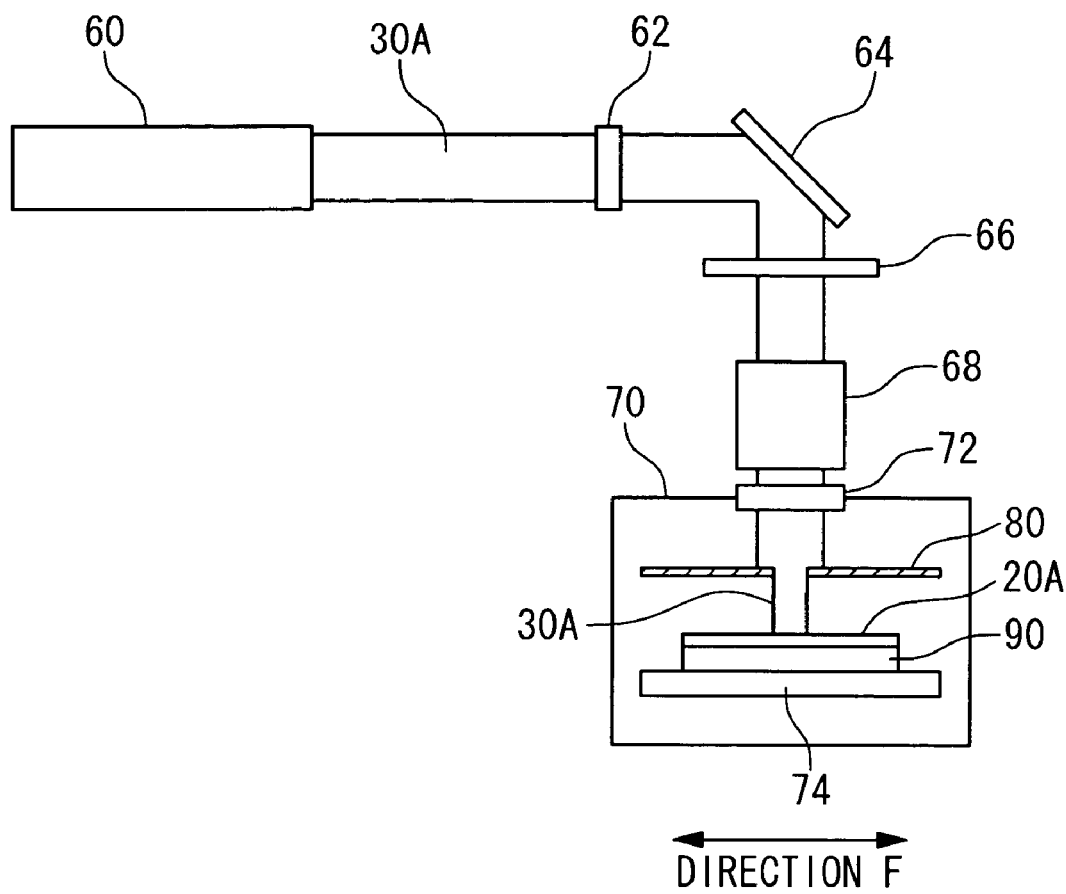
FIG. 6 shows a configuration of an apparatus for manufacturing a semiconductor thin film according an embodiment of the present invention.

FIG. 6 shows a configuration of a laser annealing apparatus, i.e., an apparatus for manufacturing a semiconductor thin film according to the present embodiment. The laser annealing apparatus has a laser oscillator 60, a homogenizer 62, a mirror 64, a mask 66, a lens 68, and a process chamber 70. The laser oscillator 60 is placed outside the process chamber 70. The process chamber 70 has a window 72, a stage 74 and a mask 80. The window 72 is provided on the wall surface of the process chamber 70. The stage 74 and the mask 80 are provided within the process chamber 70. A substrate 90 with a precursor film 20A is placed on this stage 74.

A method of manufacturing a semiconductor thin film and an operation of the laser annealing apparatus are as follows. First, a precursor film 20A is deposited on a substrate 90. This precursor film 20A is an amorphous semiconductor film or a poly-crystalline semiconductor film. For example, this precursor film 20A can be an amorphous silicon film deposited by a general deposition method such as a plasma CVD method and the like. As shown in FIG. 6, the substrate 90 with the precursor film 20A is placed on the stage 74 within the process chamber 70.

Next, an XeCl excimer laser with a wavelength of 308 nm is oscillated in a pulse shape by the laser oscillator 60. The laser light 30A outputted from the laser oscillator 60 is changed to have a predetermined beam profile through the homogenizer 62. Then, the laser light 30A is reflected by the mirror 64 to be incident into the mask 66. Passing through the mask 66, the shape of the laser light 30A is made into a predetermined beam shape. After adjusted by the lens 68, the laser light 30A is incident into the process chamber 70 through the window 72.

The mask 80 is placed on the light path of the laser light 30A between the window 72 and the precursor film 20A. This mask 80 is used for throttling the laser light 30A, i.e., the "beam cross section" of the incoming laser light 30A is reduced by this mask 80. Here, the "beam cross section" refers to the area perpendicular to the beam axis. Then, the throttled laser light 30A is irradiated to the surface of the precursor film 20A.

The laser light 30A is scanned over the precursor film 20A. Here, the stage 74 is designed to be movable in a "first direction". The first direction is the scanning direction and is defined by a direction vertical to the paper surface in FIG. 6. A "second direction" is defined by a direction on the surface of the precursor film 20A and perpendicular to the first direction, i.e., a direction perpendicular to the first direction and the beam axis. The second direction is also indicated by a direction F in FIG. 6. The substrate 90 having the precursor film 20A moves in the first direction together with the stage 74. Thus, the laser light 30A is scanned in the first (scanning) direction over the precursor film 20A.

Figure 7:
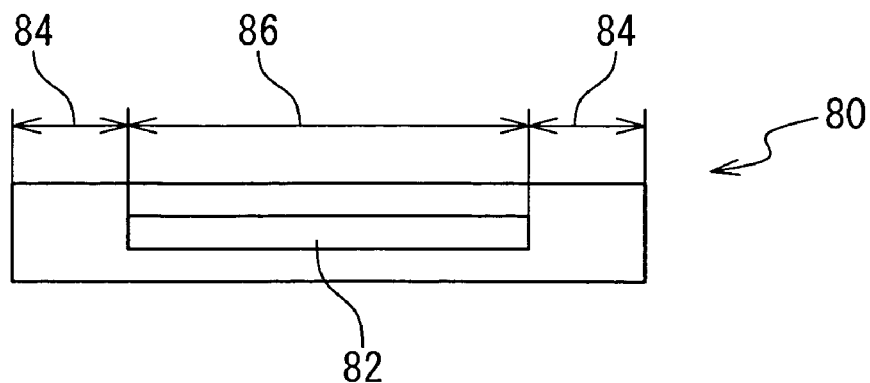
FIG. 7 is a plan view showing an example of a mask in the apparatus according to the embodiment of the present invention.

FIG. 7 is a plan view showing an example of the mask 80 in the process chamber 70. As shown in FIG. 7, the mask 80 is made of an Al plate, and a rectangular aperture 82 is formed in the center of the Al plate. As will be described later, this aperture 82 is placed on the light path of the laser light 30A. The laser light 30A passed through the aperture 82 is irradiated to the precursor film 20A. Thus, in the mask 80 shown in FIG. 7, the aperture 82 is associated with a light transmitting section 86, and the other section is associated with a light shielding section (non-transmitting section) 84. Here, "aperture length" is defined by a length of the aperture 82 along the second direction (direction F). Also, "aperture width" is defined by a width of the aperture 82 along the first direction (scanning direction).

Figure 8:
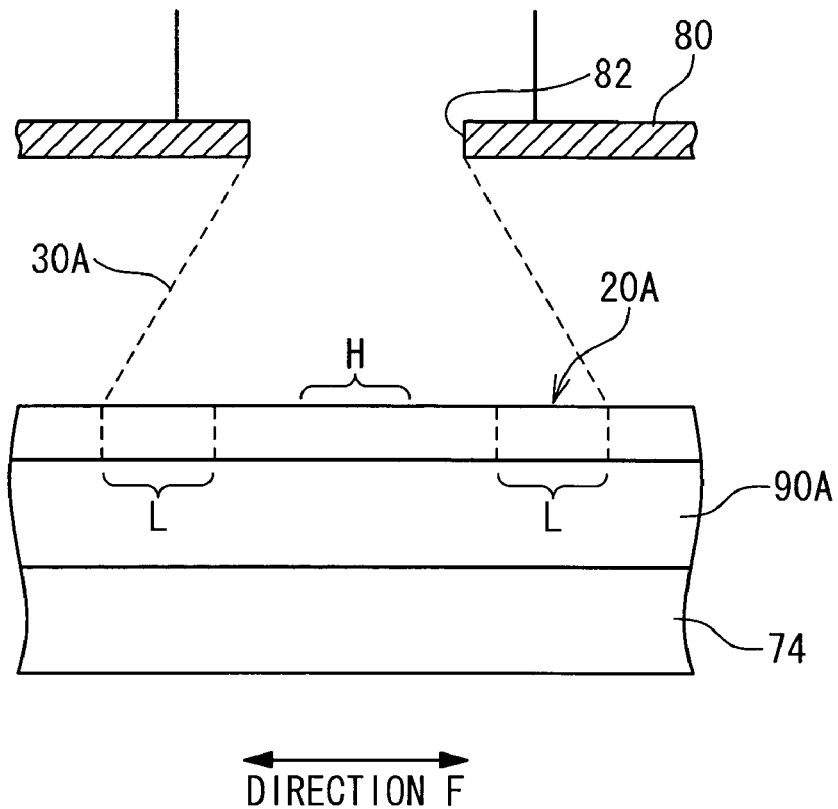
FIG. 8 is a magnified sectional view showing a step of laser annealing according to the present invention.

FIG. 8 is a magnified sectional view showing a step of laser annealing. As shown in FIG. 8, the laser light 30A is irradiated to the precursor film 20A through the aperture 82. Here, a length of the beam cross section along the second direction (direction F) is larger than the "aperture length" above the mask 80. Therefore, the laser light 30A passing through the aperture 82 is diffracted, and the diffracted laser light 30A is irradiated to a predetermined area of the precursor film 20A. Consequently, the precursor film 20A is melted in the predetermined area to which the diffracted laser light 30A is irradiated (the predetermined area is referred to as an "irradiated area"). After the irradiation of the laser light 30A is stopped, the melted area is solidified, and hence a crystallized semiconductor layer is formed.

Figure 9:
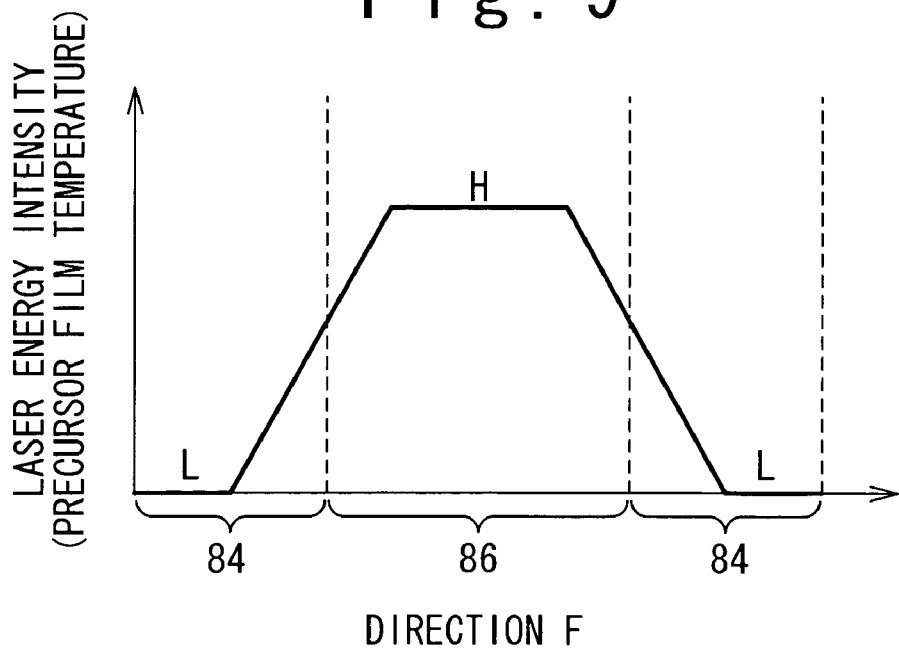
FIG. 9 shows a distribution of laser energy density according to the embodiment of the present invention.

FIG. 9 shows the distribution of laser energy intensity, i.e., the temperature distribution of the precursor film 20A in the irradiated area at the time of the laser irradiation. The temperature distribution is a distribution along the second direction. As shown in FIG. 9, the temperature distribution has a trapezoidal shape. A high temperature area indicated by a numeral "H" shown in FIG. 9 corresponds to a high temperature area "H" shown in FIG. 8. Similarly, low temperature areas "L" on both sides of the high temperature area "H" in FIG. 9 correspond to low temperature areas "L" shown in FIG. 8. Since the laser light 30A is diffracted as shown in FIG. 8, temperature gradients are generated on both sides of the high temperature area H at the center of the irradiated area. The distance between the areas with temperature gradients is in an order of sub-micron to micron.

Here, "beam length" and "beam width" are defined on the basis of the cross section of the diffracted laser light 30A. The "beam width" is defined by a width of the beam cross section along the first direction (scanning direction). The "beam length" is defined by a length of the beam cross section along the second direction (direction F). Also, the "beam length" may be defined by a FWHM (Full Width at Half Maximum) of the temperature distribution shown in FIG. 9.

According to the present invention, at the time of crystallizing the semiconductor film as mentioned above, the "beam length" is set to a value equal to or less than about two times a width along the second direction of the crystal to be formed. As a result, single-crystal regions extending in the first direction (scanning direction) can be formed in the precursor film 20A, which will be shown later.

Figure 10:
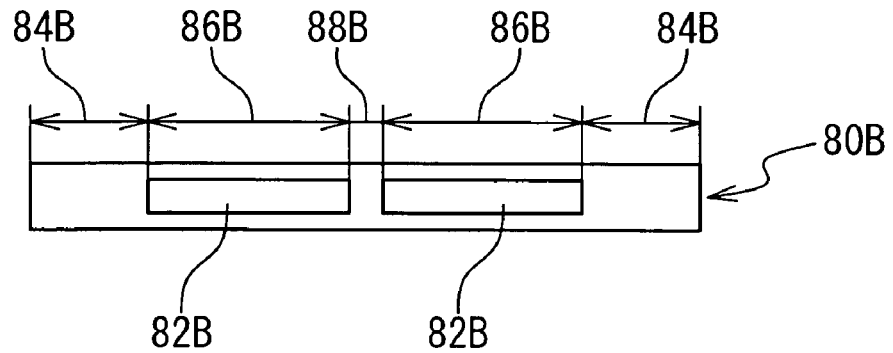
FIG. 10 is a plan view showing another example of a mask in the apparatus according to the present invention.

FIG. 10 is a plan view showing another example of the mask 80 in the process chamber 70. In this mask 80B, two rectangular apertures 82B are formed. These apertures 82B are associated with light transmitting sections 86B, and a section between two apertures 82B is associated with an interval section 88B. The other sections are associated with light shielding section 84B.

Figure 11A:
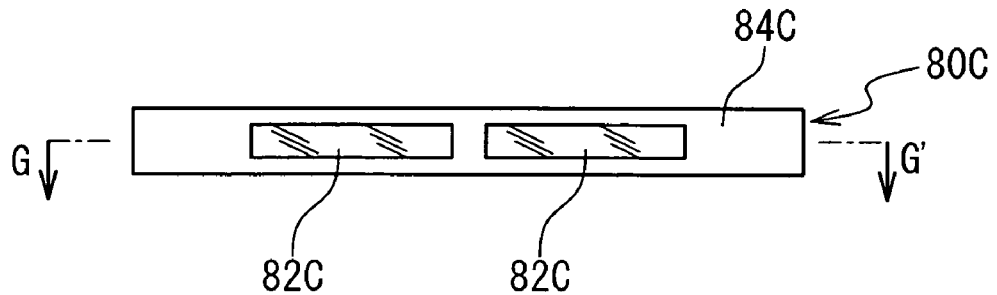
FIG. 11A is a plan view showing still another example of a mask in the apparatus according to the present invention.
Figure 11B:
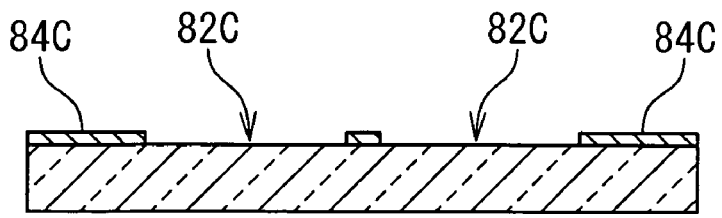
FIG. 11B is a cross sectional view along a line G-G' in FIG. 11A.

Also, the material of the mask 80 is not limited to aluminum (Al). FIG. 11A is a plan view showing still another example of the mask 80 in the process chamber 70, and FIG. 11B is a sectional view along a line G-G' in FIG. 11A. This mask 80c has a substrate made of a transparent material such as quartz and the like. Further, non-transparent pattern is formed on a predetermined area of the substrate. For example, the non-transparent pattern is formed by patterning a metal film made of, for example, aluminum, molybdenum, chrome, tungsten silicide and stainless alloy and so on. Also, a protective film such as a chrome oxide film can be laminated over the non-transparent pattern. Also, a single-layer or a multi-layer dielectric film can be used to form the non-transparent pattern. Thus, light transmitting areas 82C with rectangular shapes and a light shielding area 84C are formed in the mask 80C as shown in FIGS. 11A and 11B. These light transmitting areas correspond to apertures. A part of the laser light 30A transmits these light transmitting areas 82C to be irradiated on the precursor film 20A.

Moreover, in the mask 80 mentioned above, the shape of the aperture (the light transmitting area) 82 is not limited to rectangle. The shape can be polygon such as triangle, hexagon, octagon and the like. Also, the shape can be circle, ellipse and the like. Moreover, the aperture 82 can have a chevron shape. The step of laser annealing by using a mask 80 with any of these apertures 82 is similar to that in the case mentioned above. So, its explanation is omitted.

Also, a lot of slits with extremely thin widths can be formed in the mask 80. Or, a lot of holes can be formed concentrated in the mask 80. These slits or holes are used instead of the aperture (the light transmitting area) 82. In this case, the energy of the laser light 30A can be adjusted by changing the number of slits or the number and density of the holes.

Moreover, the above-mentioned mask 80 can be provided not only in the process chamber 70 as in FIG. 6 but also outside the process chamber 70. That is, the mask 80 can be placed at any position on the light path from the laser oscillator 60 to the precursor film 20A. Also, the mask 66 shown in FIG. 6 can be configured to have the non-transmission area similar to the mask 80 shown in FIGS. 7, 10, 11. In this case, the mask 66 replaces the mask 80, and plays the same role as the mask 80.

Furthermore, the laser light 30A used in the laser annealing is not limited to the XeCl excimer laser. Another excimer laser such as a KrF laser can be used as the laser light 30A. Also, a solid laser such as an Nd:YAG laser, an Nd:YLF laser, an Nd:YVO$_4$ laser and the like can be used. Further, a gas laser such as a carbonic acid gas laser, an argon gas laser and the like can be used.

A TFT (Thin Film Transistor) can be formed on the surface of various insulating substrates by using the manufacturing method according to the present invention. In particular, it is preferable with regard to the high integration and the high performance to use an SOI (Silicon On Insulator) in which an oxide film is formed on the surface of a silicon wafer.

Next, a plurality of examples of the manufacturing according to the present invention will be shown below together with experimental results.

FIRST EXAMPLE

Figure 12:
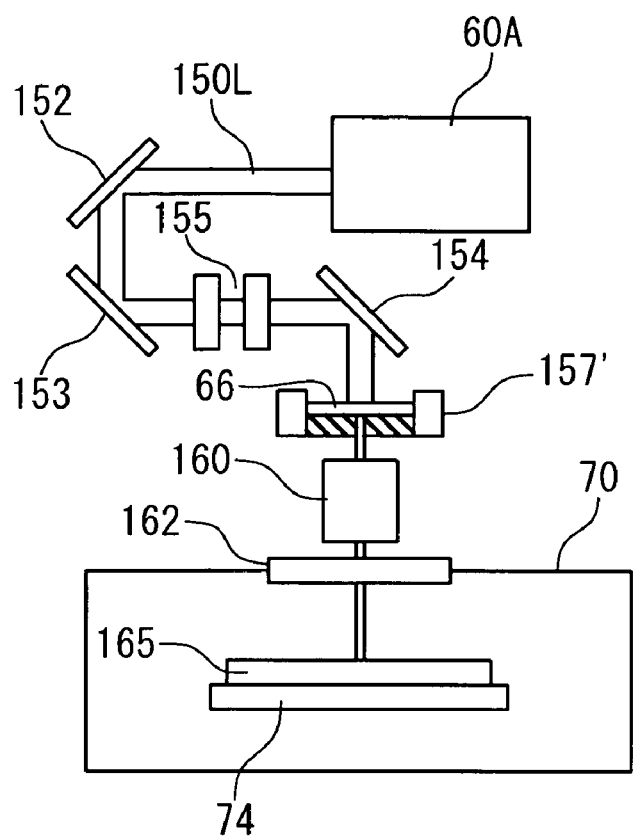
FIG. 12 is a schematic view showing a laser annealing apparatus used in a first example.

FIG. 12 is a schematic picture showing a laser annealing apparatus (an apparatus for manufacturing a semiconductor thin film) used in the present example. The laser annealing apparatus has an excimer laser oscillator 60A, mirrors 152, 153, 154, a homogenizer 155, a mask stage 157, a ⅓ reduction-imaging lens 160, and a process chamber 70. The laser annealing apparatus also has a mask 66 which is supported movably by the mask stage 157. The substrate stage 74 is provided within the process chamber 70, and a window 162 is provided on the surface of the process chamber 70.

According to this laser annealing apparatus, a substrate 165 is placed on the substrate stage 74. Then, a beam 150L (XeCl, wavelength of 308 nm) is outputted from the excimer laser oscillator 60A. As shown in FIG. 12, the beam 150L is injected into the process chamber 70 through the mirrors 152, 153, the homogenizer 155, the mirror 154, the mask 66, the ⅓ reduction-imaging lens 160 and the window 162. Then, the beam 150L is irradiated onto the substrate 165. Here, the mask stage 157 is composed of an XY stage, an air bearing, a linear motor and the like. Thus, the beam 150L can be scanned with high precision by moving the mask stage 157. It should be noted that the beam 150L can be scanned by moving the substrate stage 74, although it is scanned by moving the mask stage 157 in the present laser annealing apparatus.

The cross section of the beam 150L is made into a shape corresponding to a pattern of the aperture of the mask 66. Then, the beam 150L is irradiated into a filed area. According to the present invention, a lens with more aperture number (NA) than that of a usual laser annealing apparatus is used in order to make the intensity profile of the beam 150L steep at laser edges. Here, the NA of the lens is set to 0.2. Also, the optical system is adjusted such that a length with which the energy density of the beam 150L on the substrate 165 varies from 2% to 98% of its maximum value is 1 μm.

Figure 13:
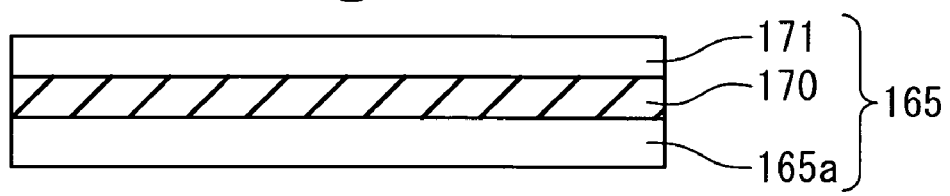
FIG. 13 is a cross sectional view schematically showing the structure of a substrate to be processed according to the first example.

Next, the substrate 165 will be described below. FIG. 13 is a cross sectional view schematically showing the structure of the substrate 165. As shown in FIG. 13, an $SiO_2$ film 170 is formed on a glass substrate 165a, and an amorphous silicon (a-Si) film 171 is formed on the $SiO_2$ film 170 as the precursor film. In this example, no-alkali glass is used for the glass substrate 165a. More specifically, the 300 nm-$SiO_2$ film 170 is deposited on the glass substrate 165a by using an LP-CVD (Low Pressure Chemical Vapor Deposition) method. The $SiO_2$ film 170 is for preventing the diffusion of impurities from the glass. The a-Si film 171 of 60 nm as the precursor film is formed on this $SiO_2$ film 170 by using the same LP-CVD method.

Figure 14:
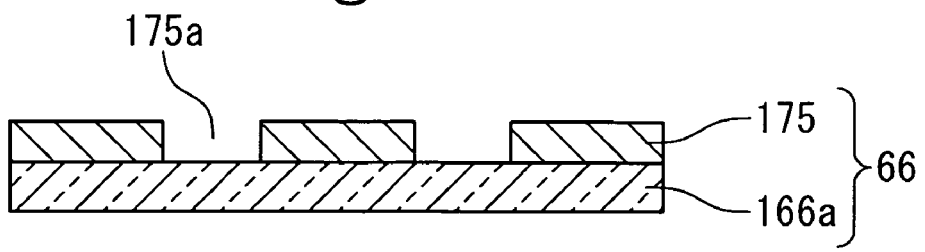
FIG. 14 is a cross sectional view schematically showing the structure of a mask in the laser annealing apparatus according to the first example.

Next, the mask 66 will be described below. FIG. 14 is a cross sectional view schematically showing the structure of the mask 66. In this mask 66, a chrome film 175 is formed on a quartz substrate 166a. The chrome film 175 plays a role of the light shielding section (referred to as a shading section, hereinafter). Thus, a plurality of aperture sections 175a are formed as an aperture pattern. These aperture sections correspond to light transmitting sections.

Figure 15:
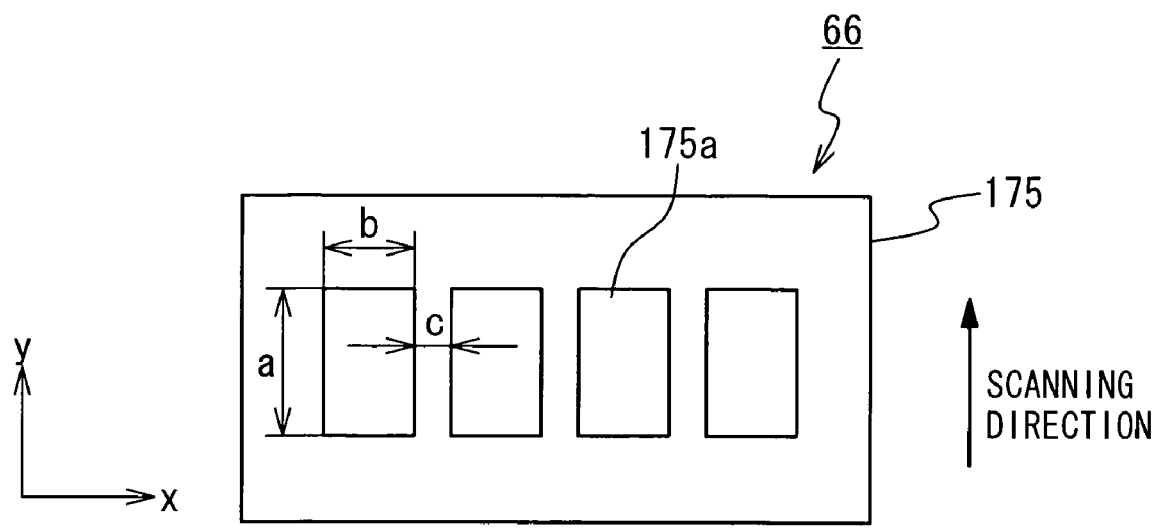
FIG. 15 is a plan view of the mask in the laser annealing apparatus according to the first example.

FIG. 15 is a plan view of the mask 66 showing the aperture pattern. The aperture pattern has a plurality of unit patterns arranged repeatedly in one direction. In FIG. 15, one rectangular aperture 175a is the unit pattern, and a plurality of the rectangular apertures 175a are arranged in x direction (the second direction mentioned above). As shown in FIG. 15, the width of the aperture 175a along the y (first) direction is "a" ("aperture width"), and the length of the aperture 175a along the x (second) direction is "b" ("aperture length"). Here, the y (first) direction is consistent with the scanning direction. Also, the distance between the adjacent apertures 175a is "c", which is referred to as an "aperture interval".

The laser annealing apparatus having the above-mentioned composition is used to manufacture the semiconductor thin film. The manufacturing process is carried out under the following experiment conditions shown in table. 1.

TABLE 1

| LASER FLUENCE | 550 mJ/cm² |
| APERTURE WIDTH a | 12 μm |
| APERTURE LENGTH b | 6 μm |
| APERTURE INTERVAL c | 1.8 μm |
| STEP WIDTH | 0.2 μm |

As mentioned above, the length with which the energy density of the beam 150L on the substrate 165 varies from 2% to 98% of its maximum value (laser fluence: 550 mJ/cm²) is set to 1 μm. Therefore, the gradient of the energy density is given by 528 mJ/cm²/μm.

Also, the "aperture width" indicates the length "a" in FIG. 15, the "aperture length" indicates the length "b" in FIG. 15, and the "aperture interval" indicates the length "C" in FIG. 15. The values a, b, c indicate lengths on the mask 66. Due to the ⅓ reduction-imaging lens 160 (see FIG. 12), the "beam width" and the "beam length" on the substrate 165 are one third of the "aperture width a" and the "aperture length b", respectively. More specifically, the "beam width" is 4 μm and "the beam length" is 2 μm on the a-Si film 171 of the substrate 165. The "step width" in the table 1 indicates the distance for which the beam 150L moves between two pulse irradiation. The scanning direction (first direction) is indicated by an arrow in FIG. 15 (upward).

Figure 16:
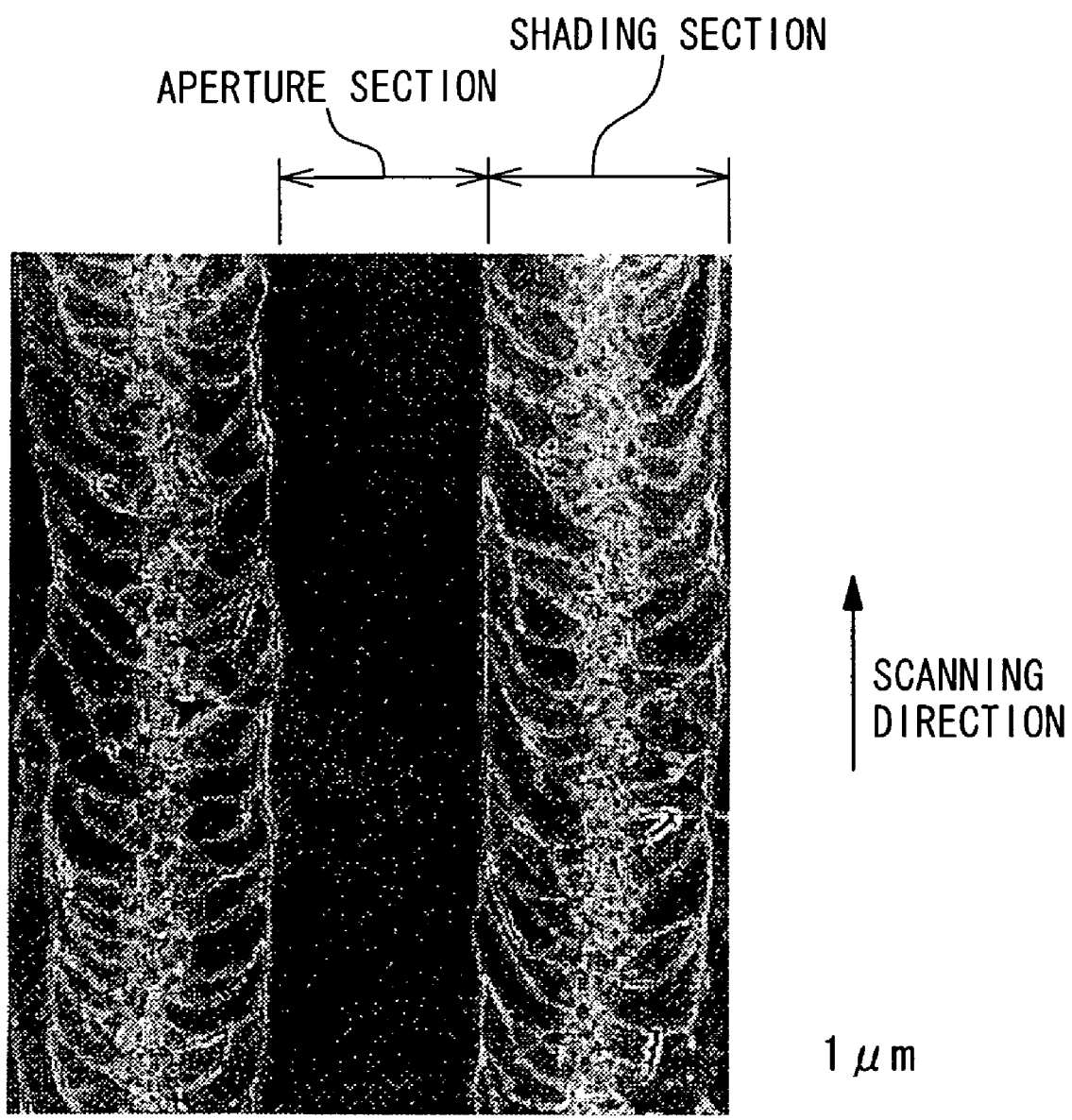
FIG. 16 shows a result of the SEM observation of the crystallized film according to the first example.

After manufacturing the semiconductor thin film, the Secco-etching is performed on that crystallized film in order to emphasis grain boundaries. Then, the obtained crystallized film is observed by using a scanning electron microscope (SEM). FIG. 16 shows a result of the SEM observation of the crystallized film formed under the conditions shown in the table 1.

It can be clearly seen from FIG. 16 that a single crystal region with no grain boundary is formed along the first (scanning) direction in the center of the image. Here, the image in FIG. 16 shows an area corresponding to one aperture section 175a and two shading sections, and it is found that the single crystal region is formed in an area corresponding to the one aperture section 175a. On the other hand, formed in areas corresponding to the two shading sections are groups of grain boundaries which extend so as to mark off the single crystal region. Thus, it is confirmed that it is possible according to the manufacturing method of the present invention to form single crystal regions with controlling locations of the grain boundaries.

SECOND EXAMPLE

Another experiment is carried out as a second example, in which the aperture interval c is changed as a variable. The experimental conditions other than the aperture interval are the same as those in the first example. In the present experiment, the aperture interval c on the mask 66 is set to 0 μm, 0.6 μm, 0.9 μm, 1.05 μm, 1.2 μm and 1.8 μm.

Figure 17:
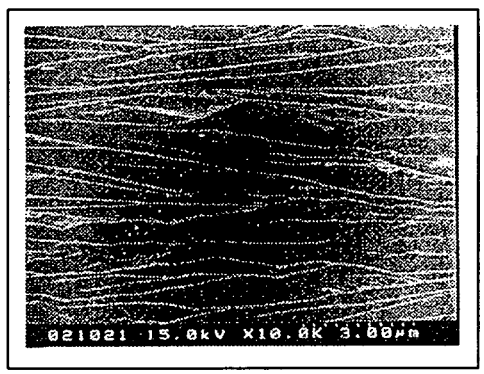
FIG. 17 shows results of the SEM observations of the crystallized films according to a second example.
Figure 17:
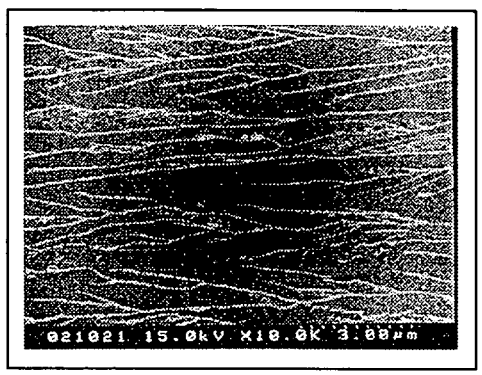
Figure 17:
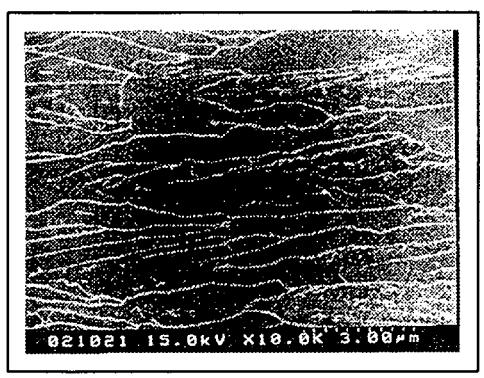
Figure 17:
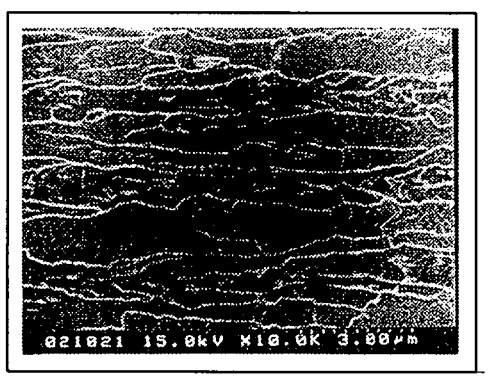
Figure 17:
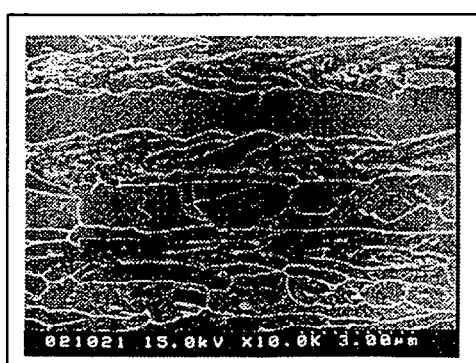
Figure 17:
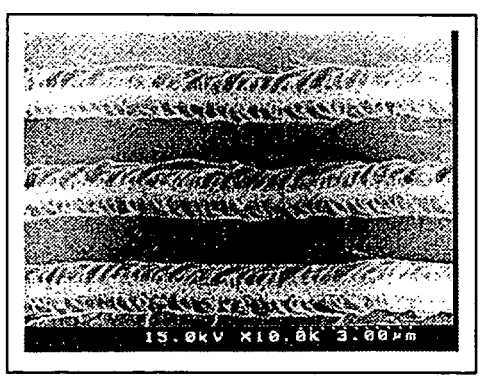

FIG. 17 shows results of the SEM observations of the crystallized films formed under the conditions with respective aperture intervals. The aperture intervals used are indicated at the bottom of respective images, and the scanning direction (first direction) is indicated by an arrow. As is clearly seen from FIG. 17, the appearances of the crystallized films vary with changing aperture intervals.

In the cases when the aperture interval is set to 0 μm or 0.6 μm, the influence of the shading section hardly appears in the SEM observation. In the case when the aperture interval is set to 0.9 μm, the difference in crystalline state begins to appear between the area corresponding to the shading section and the area corresponding to the aperture section. In the case when the aperture interval is set to 1.2 µm, it is found that a single crystal region with no grain boundaries is formed under the aperture 175a. The width of the single crystal region along the second direction is about 1 µm. In the case when the aperture interval is set to 1.8 µm (the same condition as in the first example), single crystal regions with no grain boundaries are formed under the aperture 175a with higher probability. The width of the single crystal region along the second direction is also about 1 µm.

THIRD EXAMPLE

Figure 18:
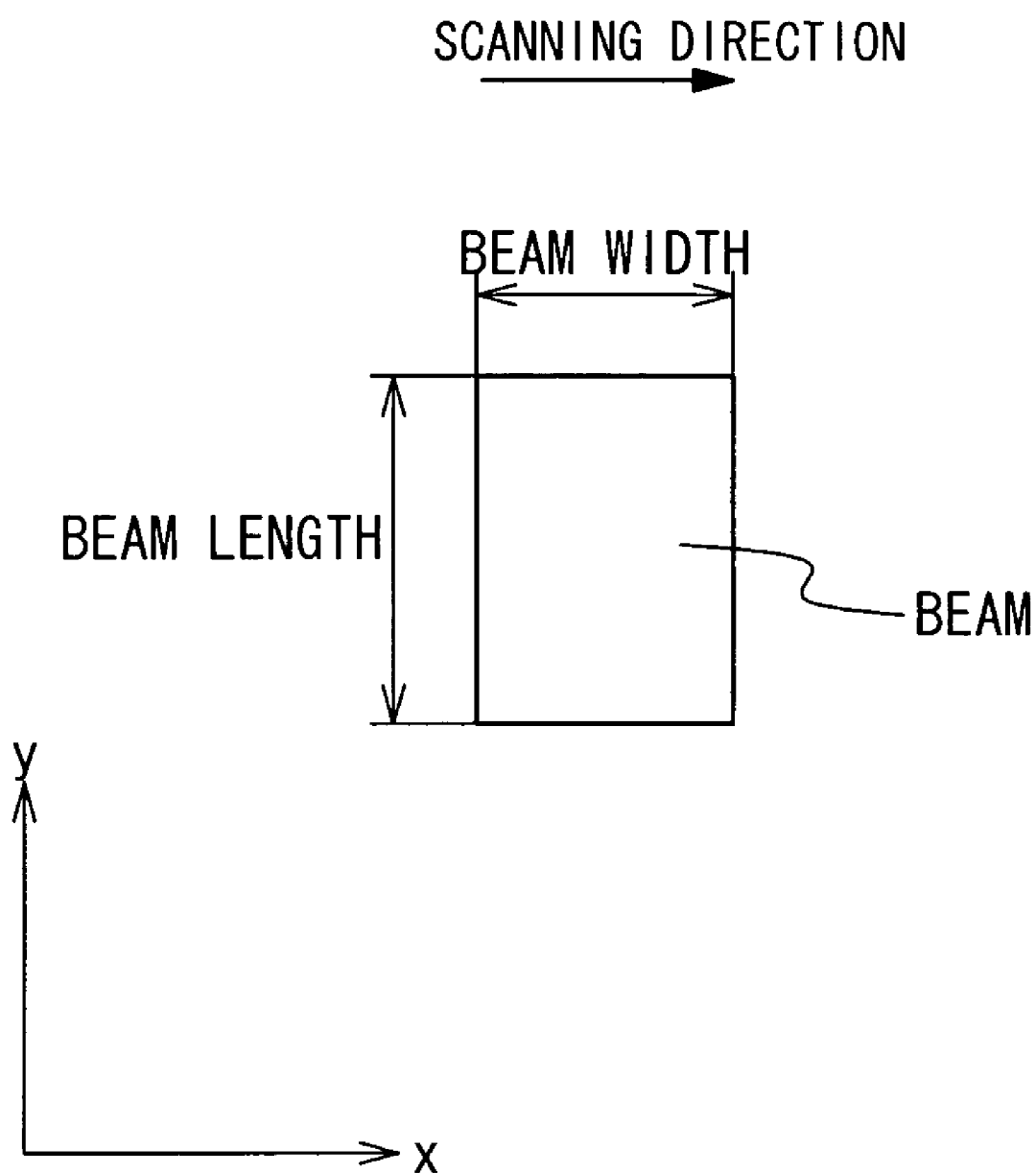
FIG. 18 is a schematic view showing the beam cross section according to a third example.

Another experiment is carried out as a third example, in which the shape of the beam shape is changed. The beam shape is rectangle as shown in FIG. 18. The beam width is a width of the beam cross section along the scanning direction (x direction in FIG. 18). The beam length is a length of the beam cross section along the second direction (y direction). The laser annealing apparatus similar to that in the first example is used to manufacture the semiconductor thin film. The experiment conditions according to the present example are shown in table 2.

TABLE 2

| | EXAMPLE 3 | COMPARATIVE EXAMPLE |
|---|---|---|
| LASER FLUENCE (mJ/cm$^2$) | 480 | 480 |
| STEP WIDTH (µm) | 0.2 | 0.2 |
| SCAN DISTANCE (µm) | 100 | 100 |
| APERTURE WIDTH (µm) | 21 | 9.9 |
| APERTURE LENGTH (µm) | 12 | 270 |

In the present example (indicated by Example 3 in table 2), the laser fluence is 480 mJ/cm$^2$, and hence the gradient of the energy density is given by 460.8 mJ/cm$^2$/µm. The step width is set to 0.2 µm, and the scan of the beam is carried out for 100 µm (scan distance). Also, the aperture width and the aperture length are set to 21 µm and 12 µm, respectively. Due to the lens 160 (see FIG. 12), the beam width and the beam length on the substrate 165 are one third of the aperture width and the aperture length, respectively. Thus, the beam width is 7 µm and the beam length is 4 µm on the a-Si film 171 of the substrate 165.

For comparison, a comparative experiment is also carried out. In the comparative experiment (indicated by Comparative Example in table 2), the laser fluence is 420 mJ/cm$^2$. The step width and the scan distance are the same as those in the Example 3. The aperture width and the aperture length are set to 9.9 µm and 270 µm, respectively. Thus, the beam length is 90 µm on the a-Si film 171 of the substrate 165, which is much longer than that in the Example 3.

Figure 19A:
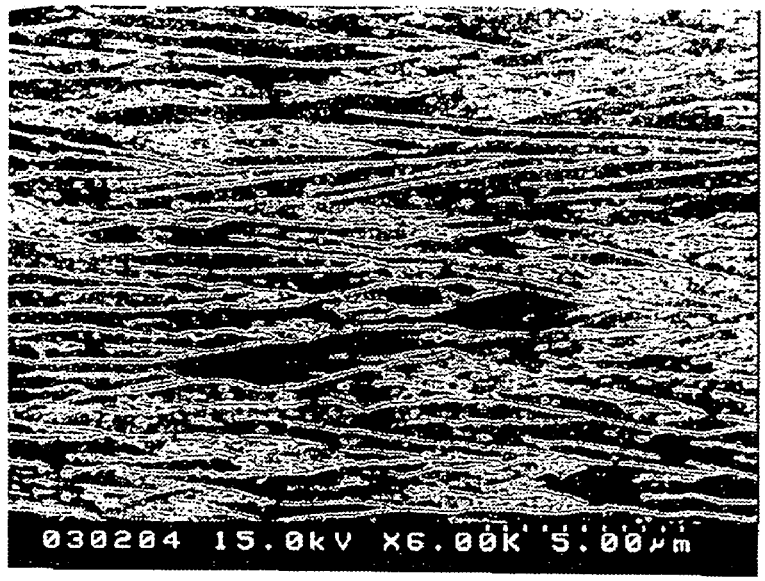
FIG. 19A shows a result of the SEM observation of the crystallized film according to a comparative example.
Figure 19B:
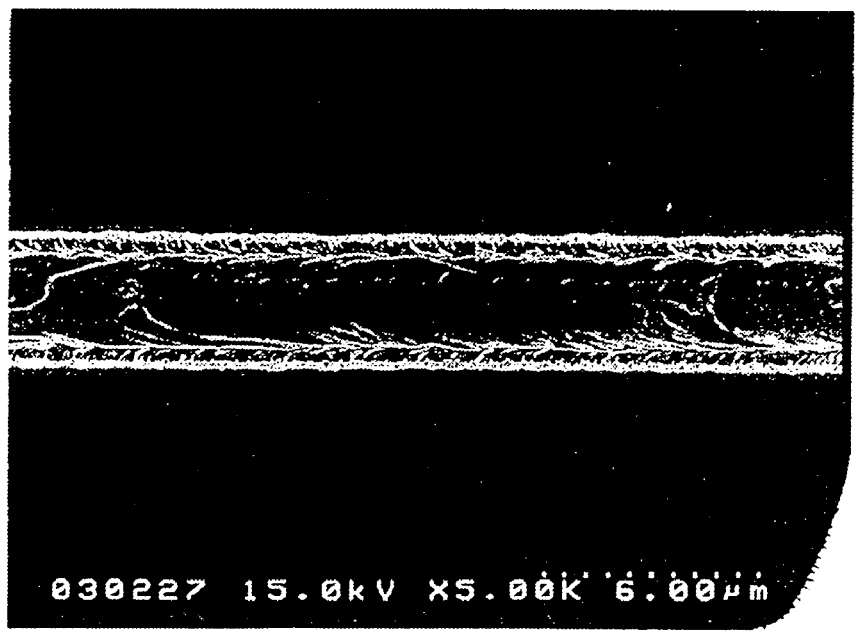
FIG. 19B shows a result of the SEM observation of the crystallized film according to the third example.

FIGS. 19A and 19B show results of the SEM observations of the crystallized films according to the comparative example and the third example, respectively. Here, after Secco-etching treatment, the crystallized films are observed. In the comparison example, as shown in FIG. 19A, oblique grain boundaries are generated randomly in the crystallized film.

On the contrary, in the third example where the aperture length is set to 12 µm and hence the beam length is set to 4 µm, as shown in FIG. 19B, a single crystal without random grain boundaries is formed in the center of the irradiation region corresponding to the aperture section. The size of the single crystal is 100 µm in the first direction (scanning direction) and 2.5 µm in the second direction. Also, a micro polycrystalline silicon region is formed on both sides of the single crystal region. The size of the poly-Si region is slightly less than 1 µm in the second direction. Thus, in the third example, the "beam length" (4 µm) is less than two times a "crystal growth width". Here, the "crystal growth width" is defined as a length along the second direction of the region including the single crystal region and the micro poly-Si region. As described above, according to the manufacturing method in the present invention, it is possible to form a single crystal region with no grain boundaries which extends in the first direction. A thin film transistor (TFT) can be made on the single crystal region associated with the irradiated region. Thus, it is possible to obtain the TFT with high uniformity and high mobility, because no grain boundary exists in the channel region of the TFT. This can solve the problems in the conventional techniques.

The reason why the single crystal region with no grain boundary is formed as shown in FIG. 19 is considered to be as follows. At first, immediately after the start of the beam scanning, crystal grains with the width of 1 µm or less grow randomly in the first direction from the regions corresponding to the beam edges. After that, during the irradiation process, the temperature gradient along the second direction is generated around the edges of the beam 150L in the second direction. Due to this temperature gradient, one of the crystal grains grows not only in the first direction but also preferentially in the second direction. As a result, the random oblique grain boundaries do not appear, and the single crystal region is formed whose size is about 2.5 µm along the second direction.

FOURTH EXAMPLE

Another experiment is carried out as a fourth example in order to investigate the beam length dependence of the crystal growth, in which the beam length is changed as a variable. The laser annealing apparatus and the mask 66 similar to those in the first example are used to manufacture the semiconductor thin film. The experiment conditions according to the present example are shown in table 3.

TABLE 3

| | EXAMPLE 4-1 | EXAMPLE 4-2 | EXAMPLE 4-3 |
|---|---|---|---|
| LASER FLUENCE (mJ/cm$^2$) | 480 | 480 | 480 |
| STEP WIDTH (µm) | 0.2 | 0.2 | 0.2 |
| SCAN DISTANCE (µm) | 100 | 100 | 100 |
| APERTURE WIDTH (µm) | 21 | 21 | 21 |
| APERTURE INTERVAL (µm) | 3 | 3 | 3 |
| APERTURE LENGTH (µm) | 12 | 18 | 30 |

In the present example, the laser fluence is 480 mJ/cm$^2$, and hence the gradient of the energy density is given by 460.8 mJ/cm$^2$/µm. The step width is set to 0.2 µm, and the scan distance is set to 100 µm. Also, the aperture width and the aperture interval are set to 21 µm and 3 µm, respectively. In Example 4-1, the aperture length is set to 12 µm, and hence the beam length is set to 4 µm. In Example 4-2, the aperture length is set to 18 µm, and hence the beam length is set to 6 µm. In Example 4-3, the aperture length is set to 30 µm, and hence the beam length is set to 10 µm. Under these conditions, the beam 150L is irradiated to the a-Si film 171.

Figure 20A:
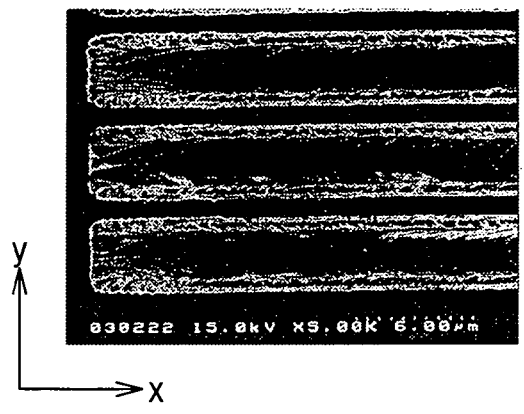
FIGS. 20A to 20C show results of the SEM observations of the crystallized films according to Examples 4-1 to 4-3, respectively.
Figure 20A:
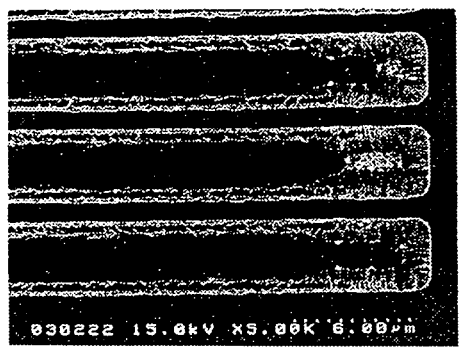
Figure 20B:
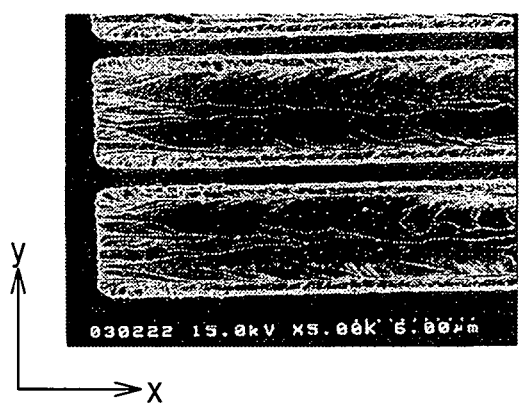
Figure 20B:
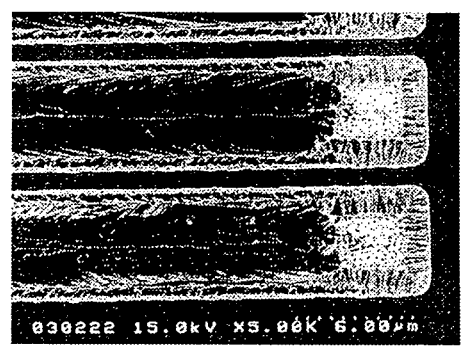
Figure 20C:
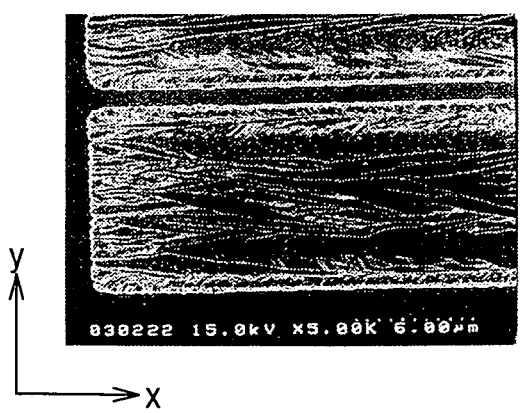
Figure 20C:
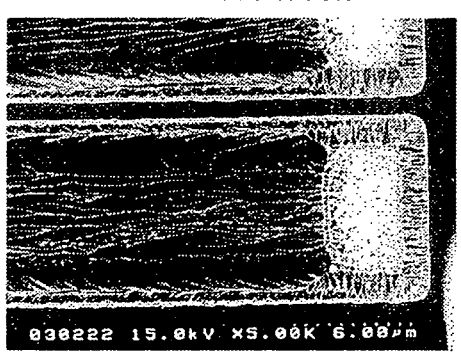
Figure 21A:
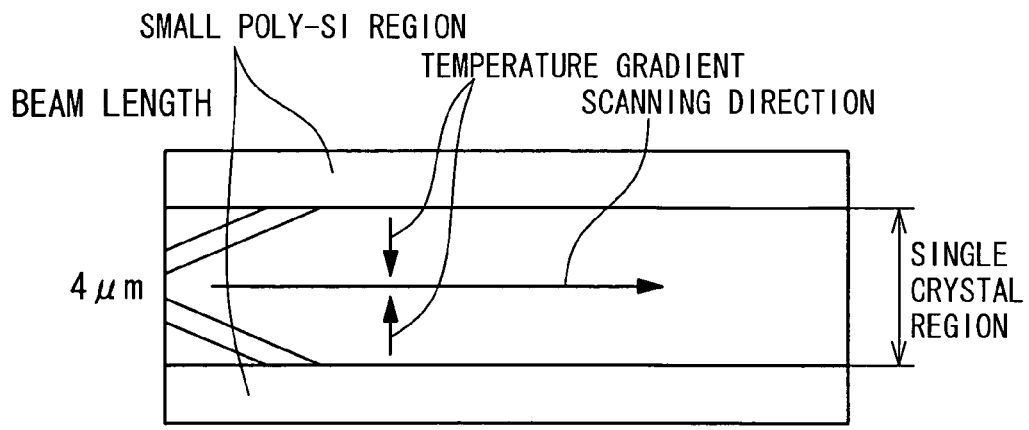
FIGS. 21A to 21C are schematic pictures showing the mechanism of the crystal growth according to Examples 4-1 to 4-3, respectively.
Figure 21B:
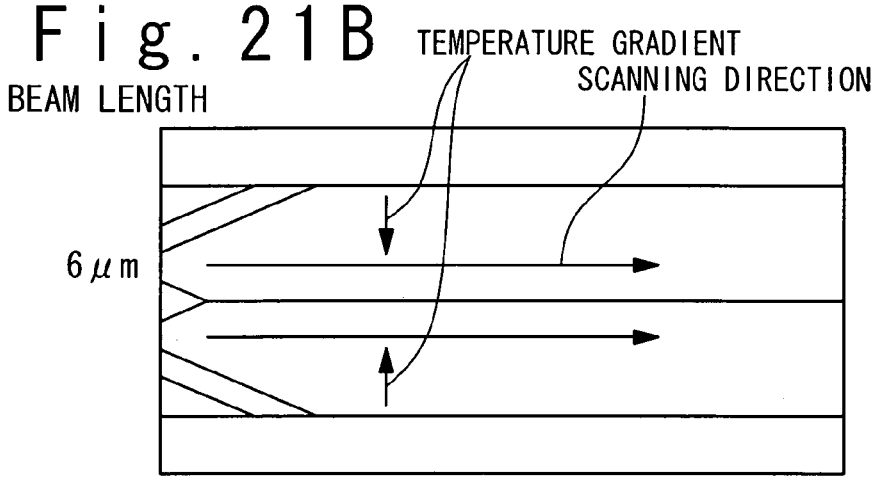
Figure 21C:
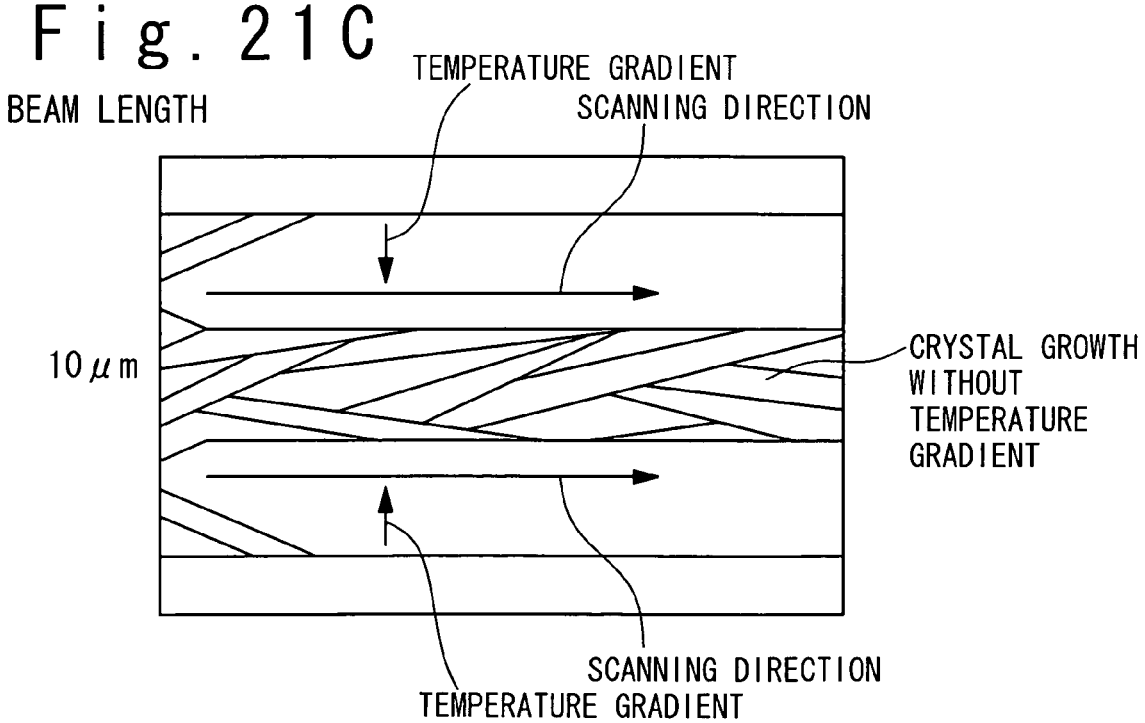

FIGS. 20A to 20C show results of the SEM observations of the crystallized films according to the Examples 4-1 to 4-3, respectively. Here, after Secco-etching treatment, the crystallized films are observed. In each FIGURE, images at the locations where the scanning starts (Starting Location) and ends (Ending Location) are shown. Also, FIGS. 21A to 21C are schematic pictures showing the mechanism of the crystal growth in the semiconductor thin film according to the Examples 4-1 to 4-3, respectively.

As shown in FIG. 20A, when the aperture length is set to 12 μm and the beam length is set to 4 μm, single crystal regions are formed at the centers of the irradiation regions. The reason for this result will be as follows. As shown in FIG. 21A, the temperature gradient along the second direction (direction y in FIG. 20A) is generated, which suppresses the occurrence of oblique grain boundaries as explained above. Thus, the single crystal regions are formed at the centers of the irradiation regions.

As shown in FIG. 20B, when the aperture length is set to 18 μm and the beam length is set to 6 μm, one straight grain boundary extending in the first direction (direction x) is formed only at the center of the irradiation region. The reason for this result will be as follows. As shown in FIG. 21B, the temperature gradient along the second direction (direction y in FIG. 20B) is generated, which suppresses the occurrence of oblique grain boundaries. Also, the "beam length" is consistent with two times the "crystal growth width" which is the length along the second direction of the region including the single crystal region and the small poly-Si region.

As shown in FIG. 20C, when the aperture length is set to 30 μm and the beam length is set to 10 μm, grain boundaries extending in the first direction (direction x) are formed at the center of the irradiation region. The reason for this result will be as follows. As shown in FIG. 21C, the temperature gradient along the second direction (direction y in FIG. 20C) around the beam edge suppresses the occurrence of oblique grain boundaries to some extent. However, since the "beam length" becomes longer than two times the "crystal growth width", the effect of the temperature gradient along the second direction becomes scarce. That's why oblique grain boundaries are formed randomly around the center of the irradiation region.

It is obvious from the results mentioned above that the single crystal region can be formed in the a-Si film 171 with controlling the positions of grain boundaries when the beam length is set to less than 6 μm, or preferably less than 4 μm. Thus, it is possible to manufacture the TFT which has high mobility and high uniformity. It should be noted that the preferable beam length depends on thickness and a deposition method of the a-Si film 171 as the precursor film, laser fluence of the beam 150L, the resolution of the optical system and so on. Hence, the beam length is not limited to 6 μm or 4 μm, and can be set to an appropriate value according to manufacturing conditions. According to the present invention for manufacturing the semiconductor thin film, the "beam length" (4 μm) is set to a value equal to or less than two times the "crystal growth width". Here, the "crystal growth width" indicates a length along the second direction of the region including the single crystal region and the small poly-Si region.

FIFTH EXAMPLE

Another experiment is carried out as a fifth example in order to investigate the aperture interval (beam interval) dependence of the crystal growth, in which the aperture interval is changed as a variable. The laser annealing apparatus and the mask 66 similar to those in the first example are used to manufacture the semiconductor thin film. The experiment conditions according to the present example are shown in table 4.

TABLE 4

|  | EXAMPLE 5-1 | EXAMPLE 5-2 |
|---|---|---|
| LASER FLUENCE (mJ/cm$^2$) | 480 | 480 |
| STEP WIDTH (μm) | 0.2 | 0.2 |
| SCAN DISTANCE (μm) | 100 | 100 |
| APERTURE WIDTH (μm) | 21 | 21 |
| APERTURE LENGTH (μm) | 12 | 12 |
| APERTURE INTERVAL (μm) | 30 | 1.5 |

In the present example, the laser fluence is 480 mJ/cm$^2$, and hence the gradient of the energy density is given by 460.8 mJ/cm$^2$/μm. The step width is set to 0.2 μm, and the scan distance is set to 100 μm. Also, the aperture width and the aperture length are set to 21 μm and 12 μm, respectively. Thus, the beam length is set to 4 μm. In Example 5-1, the aperture interval is set to 30 μm, and hence the beam interval is set to 10 μm. In Example 5-2, the aperture interval is set to 1.5 μm, and hence the beam interval is set to 0.5 μm. Under these conditions, the beam 150L is irradiated to the a-Si film 171.

Figure 22A:
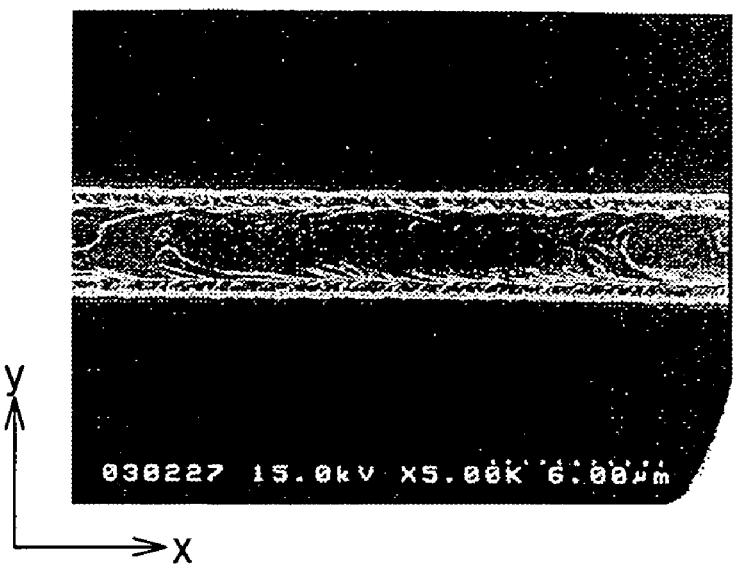
FIGS. 22A and 22B show results of the SEM observations of the crystallized films according to Examples 5-1 and 5-2, respectively.
Figure 22B:
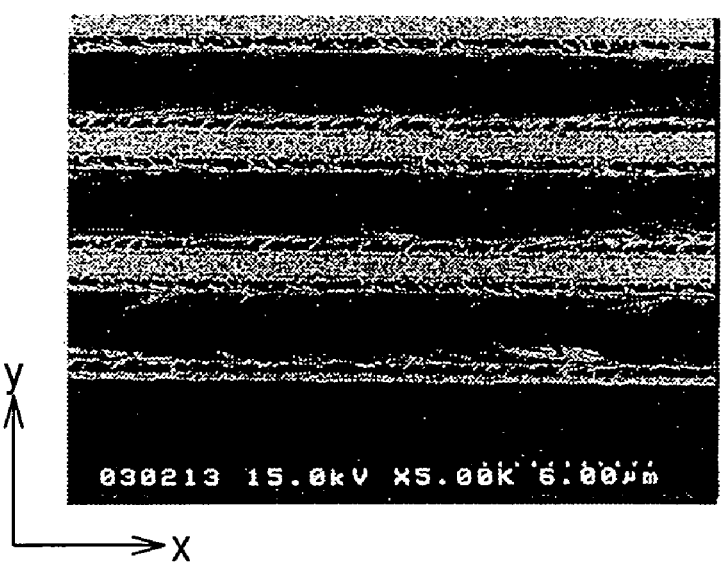

FIGS. 22A and 22B show results of the SEM observations of the crystallized films according to the Examples 5-1 and 5-2, respectively. Here, after Secco-etching treatment, the crystallized films are observed. It is found by comparing images in FIGS. 22A and 22B that there exists no conspicuous difference in size of the single crystal region and crystalline status between the crystallized films formed under both conditions. Thus, it is concluded based on the results obtained from the present example and the second example (see FIG. 17) that a certain length is necessary for the aperture interval. However, the aperture interval has no influence on the crystalline status of the crystallized film formed on the a-Si film 171, if the aperture interval is longer than the certain length.

SIXTH EXAMPLE

In the above-mentioned examples, the mask 66 shown in FIG. 15 is used for manufacturing the semiconductor thin film. In this mask 66 shown in FIG. 15, the plurality of the rectangular apertures 175a are arranged in the second direction.

Figure 23:
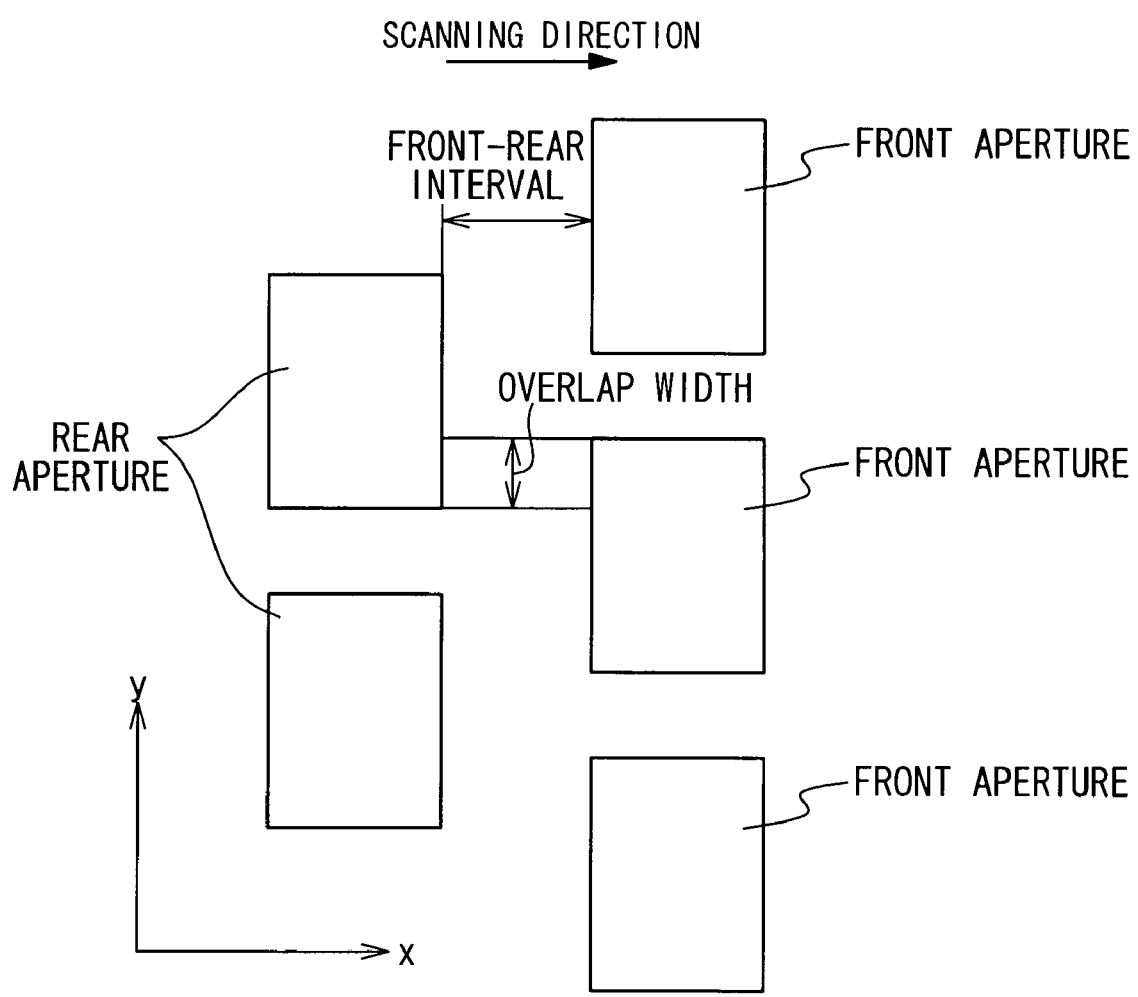
FIG. 23 is a schematic picture showing an aperture pattern of a mask according to a sixth example.

Another experiment is carried out as a sixth example in order to reduce the number of grain boundaries. Used in the present example for manufacturing the semiconductor thin film is a laser annealing apparatus which is similar to that in the first example but has a different mask 66. FIG. 23 is a schematic picture showing an aperture pattern of the mask 66 in the sixth example. The mask 66 according to the present example has a plurality of aperture groups arranged in the first direction (scanning direction; direction x). Each of the plurality of aperture groups includes a plurality of rectangular apertures arranged along the second direction (direction y). For example, the mask 66 in FIG. 23 has two aperture groups, a front aperture group and a rear aperture group. The front aperture group includes three front apertures arranged along the second direction. The rear aperture group includes two rear apertures arranged along the second direction.

The "aperture width", the "aperture length" and the "aperture interval" can be defined in a similar way to the above-mentioned examples. A "front-rear interval" is defined by an interval between adjacent aperture groups, i.e., between the front aperture group and the rear aperture group. Also, as shown in FIG. 23, an "overlap width" is defined by a width along the second direction for which apertures belonging to adjacent aperture groups overlap.

The mask 66 mentioned above is used to manufacture the semiconductor thin film. The experiment conditions according to the present example are shown in table 5.

TABLE 5

|  | EXAMPLE 6-1 | EXAMPLE 6-2 |
|---|---|---|
| LASER FLUENCE (mJ/cm$^2$) | 480 | 480 |
| STEP WIDTH (μm) | 0.2 | 0.2 |
| SCAN DISTANCE (μm) | 100 | 100 |
| APERTURE WIDTH (FRONT) (μm) | 9 | 9 |
| APERTURE LENGTH (FRONT) (μm) | 12 | 12 |
| APERTURE INTERVAL (FRONT) (μm) | 3 | 6 |
| APERTURE WIDTH (REAR) (μm) | 9 | 9 |
| APERTURE LENGTH (REAR) (μm) | 12 | 9 |
| APERTURE INTERVAL (REAR) (μm) | 3 | 9 |
| FRONT-REAR INTERVAL (μm) | 15 | 15 |
| OVERLAP WIDTH (μm) | 4.5 | 1.5 |

In the present example, the laser fluence is 480 mJ/cm$^2$, and hence the gradient of the energy density is given by 460.8 mJ/cm$^2$/μm. The step width is set to 0.2 μm, and the scan distance is set to 100 μm. In Example 6-1, the aperture width, the aperture length and the aperture interval for each aperture are set to 9 μm, 12 μm and 3 μm, respectively. Also, the front-rear interval and the overlap width are set to 15 μm and 4.5 μm, respectively. In Example 6-2, the aperture width, the aperture length and the aperture interval for each of front apertures are set to 9 μm, 12 μm and 6 μm, respectively. The aperture width, the aperture length and the aperture interval for each of 15 front apertures are set to 9 μm, 9 μm and 9 μm, respectively. Also, the front-rear interval and the overlap width are set to 15 μm and 1.5 μm, respectively. Under these conditions, the beam 150L is irradiated to the a-Si film 171. Here, the beam 150L corresponding to the front aperture is referred to as a front beam. Also, the beam 150L corresponding to the rear aperture is referred to as a rear beam. Thus, a plurality of the front beams belong to a "front beam group", and a plurality of the rear beams belong to a "rear beam group".

Figure 24A:
FIGS. 24A and 24B show results of the SEM observations of the crystallized films according to Examples 6-1 and 6-2, respectively.
Figure 24A:
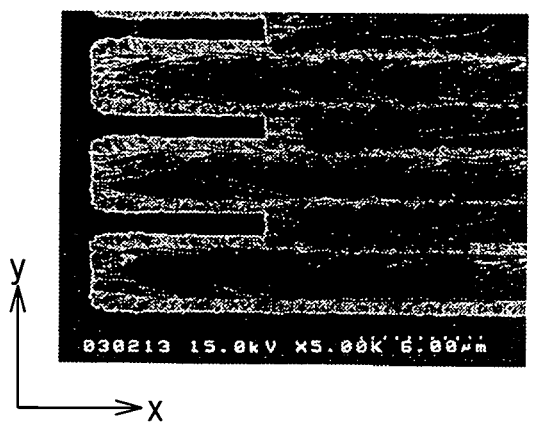
Figure 24A:
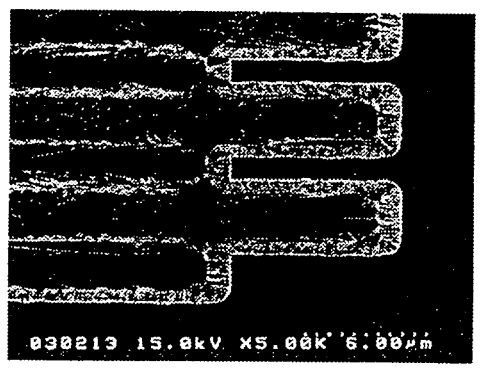
Figure 24B:
Figure 24B:
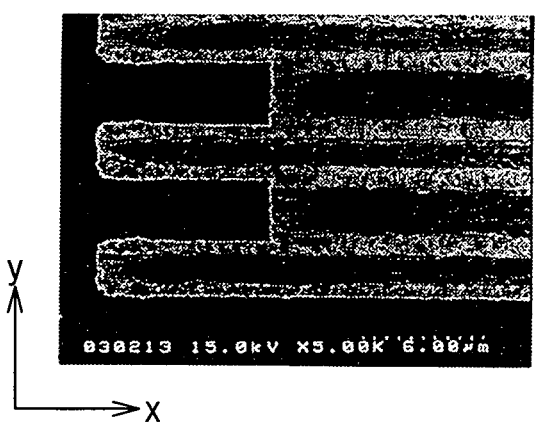
Figure 24B:
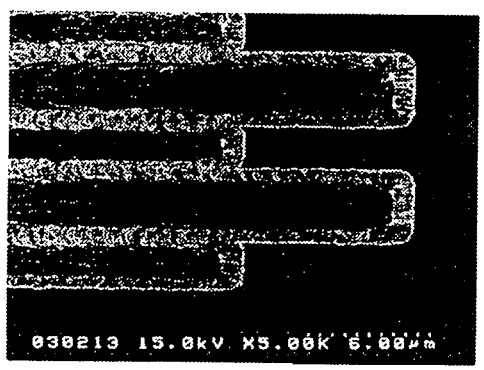

FIGS. 24A and 24B show results of the SEM observations of the crystallized films according to the Examples 6-1 and 6-2, respectively. Here, after Secco-etching treatment, the crystallized films are observed. In each FIGURE, images at the locations where the scanning starts (Starting Location) and ends (Ending Location) are shown.

In the Example 6-1, the overlap width is 4.5 μm which means that an overlap width of the beam 150L on the substrate (referred to as a "beam overlap width") is 1.5 μm. In this case, as shown in FIG. 24A, the small poly-Si regions formed by the front beams and regions corresponding to the shading sections between the front apertures become single crystal regions because the irradiation of the rear beams is performed. Found in FIG. 24A are straight grain boundaries, which are formed along the first direction and are parallel with each other. Obviously, the positions of these grain boundaries are controlled, and the number of the grain boundaries are reduced. A TFT can be manufactured by using the obtained semiconductor film. In the TFT, the channel layer is formed such that electrons move along the first direction (a direction along which the single crystal regions are extending). Thus, it is possible to form the TFT having high mobility and high uniformity.

In the Example 6-2, the overlap width is 1.5 μm which means that an overlap width of the beam 150L on the substrate (a beam overlap width) is 0.5 μm. In this case, as shown in FIG. 24B, the small poly-Si regions remain between the single crystal regions extending in the first direction and formed by the front beams and the rear beams.

It is found from the results mentioned above that the small poly-Si region extending in the first direction can be removed by setting the beam overlap width to a value equal to or larger than the width along the second direction of the small poly-Si region. In this example, the beam overlap width should be equal to or more than 0.7 μm. It should be noted that the number of aperture groups is not limited to two, and can be more than three.

SEVENTH EXAMPLE

In the present example, the mobility of two TFTs will be compared. A first TFT was made from a semiconductor thin film formed by using a mask with comparatively large aperture 175a. A second TFT was made from a semiconductor thin film formed by using a mask with comparatively small aperture 175a.

In manufacturing the first TFT, the laser annealing apparatus and the substrate 165 similar to those in the first example were used. Here, the "aperture length" was set to 270 μm, and hence the "beam length" was set to 90 μm, which did not meet the requirements of the present invention. Also, the "aperture width" was set to 9.9 μm, and hence the "beam width" was set to 3.3 μm. The scan distance was 300 μm. As a result, a poly-crystalline film with oblique grain boundaries was formed under those conditions. Then, the first TFT (n-ch TFT) was manufactured by using this poly-crystalline film as an active layer. The channel length of the first TFT was 1.4 μm and the channel width of the first TFT was 1.4 μm. The measured mobility of the first TFT obtained was 360 cm$^2$/Vs.

In manufacturing the second TFT, the laser annealing apparatus and the substrate 165 similar to those in the first example were used. Here, the "aperture length" was set to 12 μm, and hence the "beam length" was set to 4 μm, which met the requirements of the present invention. Also, the "aperture width" was set to 21 μm, and hence the "beam width" was set to 7 μm. The scan distance was 300 μm. As a result, a semiconductor thin film with a single crystal region was formed under those conditions.

Figure 25A:
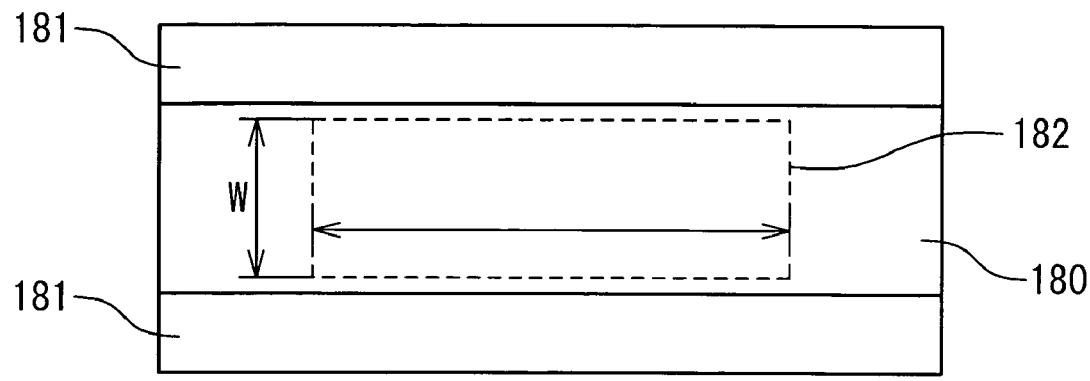
FIG. 25A is a plan view schematically showing a semiconductor thin film with a single crystal region according to a seventh example.

FIG. 25A is a plan view schematically showing the semiconductor thin film with the single crystal region according to the present example. As shown in FIG. 25A, the single crystal region 180 was formed in an a-Si region 181. The length of the single crystal region 180 along the scanning direction was 300 μm corresponding to the scan distance. Also, the width of the single crystal region 180 along the second direction was 2.5 μm. Then, an island 182 was formed in the single crystal region 180 as shown in FIG. 25A. The length of the island 182 along the scanning direction (indicated by a numeral 1 in FIG. 25A) was 10 μm. Also, the width of the island 182 along the second direction (indicated by a numeral w in FIG. 25A) was 1.4 μm.

Figure 25B:
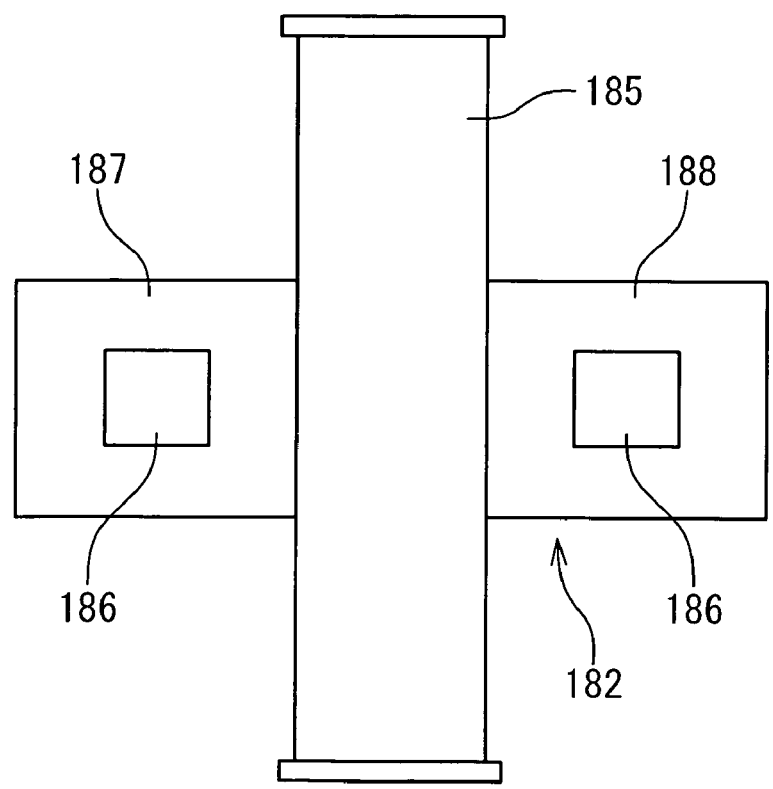
FIG. 25B is a plan view schematically showing a thin film transistor according to the seventh example.

Then, as shown in FIG. 25B, a source 187 and a drain 188 were formed on the island 182. Further, a gate electrode 185 crossing over the island 182 was formed through an insulating film (not shown). Also, contacts 186 were formed so as to be electrically connected to the source 187 and the drain 188, respectively. Thus, a field effect transistor is formed. Here, a channel region is formed such that carriers move along the first direction. In this way, the second TFT (n-ch TFT) was formed. The channel length of the second TFT was 1.4 μm and the channel width of the second TFT was 1.4 μm. The measured mobility of the second TFT obtained was 520 cm²/Vs.

It is obvious from the above comparison that the mobility of the second TFT is higher than that of the first TFT. That is to say, the second TFT manufactured by the method according to the present invention has higher mobility than the first TFT. Thus, a TFT with high performance can be provided by using the manufacturing method according to the present invention.

As described above in detail, according to the method and the apparatus for manufacturing the semiconductor thin film in the present invention, the following effects can be attained. That is, the width of the crystal along the second direction can be made larger than that of a conventional semiconductor thin film, because of the temperature gradient generated along the second direction. Moreover, the positions of the grain boundaries can be controlled, and also the number of the grain boundaries can be reduced. Also, the positions and the number of the crystals can be controlled.

Furthermore, according to the present invention, a thin film transistor (TFT) is manufactured by using the single crystal region generated by the above apparatus and the above method. Thus, the mobility of the manufactured TFT is improved, because the number of the grain boundaries is reduced. This implies that a TFT with high mobility can be obtained according to the present invention. Moreover, since the number and the directions of the grain boundaries are controlled and hardly vary, the variation in the mobility of the TFT can be suppressed.

It will be obvious to one skilled in the art that the present invention may be practiced in other embodiments that depart from the above-described specific details. The scope of the present invention, therefore, should be determined by the following claims.

What is claimed is:

1. A method of manufacturing a semiconductor thin film comprising:
   (A) forming an amorphous semiconductor film on a substrate;
   (B) irradiating a beam to a surface of said amorphous semiconductor film such that a predetermined region of said amorphous semiconductor film is melted and solidified to form a crystallized semiconductor film; and
   (C) scanning said beam in a first direction,
   wherein a second direction is a direction on said surface of said amorphous semiconductor film perpendicular to said first direction,
   wherein a length along said second direction of a cross section of said beam, as a beam length, is substantially equal to or less than two times a width along said second direction of said crystallized semiconductor film, as a crystal growth width, and
   wherein the crystallized semiconductor film includes at least one single-crystal region having a crystal growth length that is greater than the crystal growth width and that extends in a direction substantially parallel to the first direction.

2. The method according to claim 1, wherein said beam length is substantially equal to or less than said crystal growth width.

3. The method according to claim 1, wherein said beam length is equal to or less than 6 μm.

4. A method of manufacturing a semiconductor thin film comprising:
   (AA) forming an amorphous semiconductor film on a substrate;
   (BB) irradiating a plurality of beams to a surface of said amorphous semiconductor film such that predetermined regions of said amorphous semiconductor film are melted and solidified to form a plurality of crystallized semiconductor films; and
   (CC) scanning said plurality of beams in a first direction,
   wherein a second direction is a direction on said surface of said amorphous semiconductor film perpendicular to said first direction,
   wherein a length along said second direction of a cross section of each of said plurality of beams, as a beam length, is substantially equal to or less than two times a width along said second direction of corresponding one of said plurality of crystallized semiconductor films, as a crystal growth width, and
   wherein the crystallized semiconductor film includes at least one single-crystal region having a crystal growth length that is greater than the crystal growth width and that extends in a direction substantially parallel to the first direction.

5. The method according to claim 4, wherein a plurality of said beam lengths of said plurality of beams are substantially equal to or less than a plurality of said crystal growth widths of said plurality of crystallized semiconductor films, respectively.

6. The method according to claim 4, wherein said beam length of said each beam is equal to or less than 6 μm.

7. The method according to claim 4, wherein said plurality of beams are arranged along said second direction.

8. The method according to claim 7, wherein an interval between one of said plurality of beams and an adjacent one of said plurality of beams is equal to or more than 0.3 μm.

9. The method according to claim 7, wherein an interval between one of said plurality of beams and an adjacent one of said plurality of beams is equal to or more than 0.4 μm.

10. The method according to claim 7, wherein an interval between one of said plurality of beams and an adjacent one of said plurality of beams is equal to or more than 0.6 μm.

11. The method according to claim 4, wherein each of said plurality of beams belongs to any one of a plurality of beam groups, and each of said plurality of beam groups includes a predetermined number of said beams,
    wherein said plurality of beam groups are arranged in said first direction,
    wherein said predetermined number of beams belonging to said each beam group are arranged along said second direction.

12. The method according to claim 11, wherein one of said plurality of beam groups includes a first beam, and another of said plurality of beam groups includes a second beam,
    wherein a part of said first beam overlaps with a part of said second beam along said first direction.

13. The method according to claim 12, wherein a width for which said first beam overlaps with said second beam is equal to or more than 0.7 μm.

14. A method of manufacturing a semiconductor thin film comprising:
   (D) forming an amorphous semiconductor film on a substrate;

(E) irradiating a beam to a surface of said amorphous semiconductor film such that a predetermined region of said amorphous semiconductor film is melted and solidified to form a crystallized semiconductor film; and
(F) scanning said beam in a first direction,
wherein a second direction is a direction on said surface of said amorphous semiconductor film perpendicular to said first direction,
wherein during said (E) irradiating, a temperature distribution of said surface along said second direction has two gradients near both ends of said predetermined region,
wherein a full width at half maximum (FWHM) of said temperature distribution is substantially equal to or less than two times a width along said second direction of said crystallized semiconductor film, as a crystal growth width, and
wherein the crystallized semiconductor film includes at least one single-crystal region having a crystal growth length that is greater than the crystal growth width and that extends in a direction substantially parallel to the first direction.

15. The method according to claim 14, wherein said FWHM of said temperature distribution is substantially equal to or less than said crystal growth width.

16. The method according to claim 14, wherein, in said (E) irradiating, said two gradients along said second direction are generated by changing amount of said beam along said second direction.

17. The method according to claim 15, wherein, in said (E) irradiating, said two gradients along said second direction are generated by changing amount of said beam along said second direction.

18. The method according to claim 16, wherein change in said amount of said beam along said second direction is equal to or more than 460.8 mJ/cm2 per 1 µm on said surface.

19. A method of manufacturing a thin film transistor comprising:
(a) forming an amorphous semiconductor film on a substrate;
(b) irradiating a beam to a surface of said amorphous semiconductor film such that a predetermined region of said amorphous semiconductor film is melted and solidified to form a crystal;
(c) scanning said beam in a first direction to form a crystallized semiconductor thin film; and
(d) forming a channel region of said thin film transistor by using said crystallized semiconductor thin film such that carriers move along said first direction,
wherein a second direction is a direction on said surface of said amorphous semiconductor film perpendicular to said first direction,
wherein a beam length along said second direction of a cross section of said beam is substantially equal to or less than two times a crystal growth width along said second direction of said crystallized semiconductor thin film, and
wherein the crystallized semiconductor film includes at least one single-crystal region having a crystal growth length that is greater than the crystal growth width and that extends in a direction substantially parallel to the first direction.

\* \* \* \* \*